(12) United States Patent
Tanaka

(10) Patent No.: US 10,974,957 B2
(45) Date of Patent: Apr. 13, 2021

(54) PHYSICAL QUANTITY SENSOR, COMPLEX SENSOR, INERTIAL MEASUREMENT UNIT, PORTABLE ELECTRONIC DEVICE, ELECTRONIC DEVICE, AND VEHICLE

(71) Applicant: Seiko Epson Corporation, Tokyo (JP)

(72) Inventor: Satoru Tanaka, Chino (JP)

(73) Assignee: Seiko Epson Corporation

( * ) Notice: Subject to any disclaimer, the term of this patent is extended or adjusted under 35 U.S.C. 154(b) by 188 days.

(21) Appl. No.: 16/115,673

(22) Filed: Aug. 29, 2018

(65) Prior Publication Data
US 2019/0062149 A1    Feb. 28, 2019

(30) Foreign Application Priority Data
Aug. 30, 2017    (JP) .............................. JP2017-165178

(51) Int. Cl.
*B81B 3/00*    (2006.01)
*G01P 15/125*    (2006.01)
(Continued)

(52) U.S. Cl.
CPC .......... *B81B 3/0072* (2013.01); *B81B 7/0048* (2013.01); *G01P 15/125* (2013.01);
(Continued)

(58) Field of Classification Search
CPC ........................ G01P 2015/0831; B81B 7/0048
See application file for complete search history.

(56) References Cited

U.S. PATENT DOCUMENTS 9,316,666 B2 *    4/2016    Suzuki ................... G01P 15/18
2004/0079154 A1    4/2004    Yoshikawa et al.
(Continued)

FOREIGN PATENT DOCUMENTS

JP    2004-093226 A    3/2004
JP    2007-298405 A    11/2007
(Continued)

OTHER PUBLICATIONS

Yukihisa Yoshida et al., "Development of Deep Reactive Ion Etching (Deep-RIE) Process for Bonded Silicon-Glass Structures", T. IEE Japan, vol. 122-E, No. 8, 2002, pp. 391-397, with English translation.

*Primary Examiner* — Paul M. West
*Assistant Examiner* — Mark A Shabman
(74) *Attorney, Agent, or Firm* — Harness, Dickey & Pierce, P.L.C.

(57) ABSTRACT

A physical quantity sensor includes: a movable body that includes a beam portion as a rotation shaft, a coupling portion that is connected with the beam portion and is provided in a direction intersecting with the beam portion, and a first and a second mass portions as a mass portion that are connected with the coupling portion; a first and a second fixed electrodes as a measurement electrode that are provided on a support substrate and are opposed to the first and the second mass portions; and a protrusion that is provided in a region where the first and the second fixed electrodes are provided and protrudes from the support substrate toward the first and the second mass portions, in which a length of the coupling portion in the intersecting direction is 1.4 or more times a length from the beam portion to the first and the second mass portions.

12 Claims, 16 Drawing Sheets

(51) Int. Cl.
B81B 7/00 (2006.01)
*G01P 15/08* (2006.01)

(52) U.S. Cl.
CPC ............... *B81B 2201/0235* (2013.01); *G01P 2015/0871* (2013.01)

(56) References Cited

U.S. PATENT DOCUMENTS

| | | | | |
|---|---|---|---|---|
| 2005/0268719 A1* | 12/2005 | Malametz | ............... | H01G 5/18 73/514.32 |
| 2010/0024553 A1* | 2/2010 | Classen | ............... | G01P 15/0802 73/514.32 |
| 2010/0281980 A1 | 11/2010 | Yazawa et al. | | |
| 2012/0186346 A1* | 7/2012 | McNeil | ............... | G01P 15/125 73/514.32 |
| 2014/0230546 A1* | 8/2014 | Allegato | ............... | B81B 7/0074 73/504.02 |
| 2014/0298909 A1* | 10/2014 | Simoni | ............... | B81B 7/0048 73/514.32 |
| 2014/0338450 A1* | 11/2014 | Classen | ............... | G01P 15/125 73/514.32 |
| 2014/0338451 A1* | 11/2014 | Takagi | ............... | B81B 3/0008 73/514.32 |
| 2015/0020591 A1* | 1/2015 | Tanaka | ............... | B81B 3/0021 73/514.32 |
| 2015/0241466 A1* | 8/2015 | Tanaka | ............... | G01P 15/125 73/514.32 |
| 2016/0047839 A1* | 2/2016 | Tanaka | ............... | G01P 15/125 73/514.32 |
| 2016/0054353 A1* | 2/2016 | Tanaka | ............... | G01P 15/125 73/514.32 |
| 2017/0023606 A1* | 1/2017 | Naumann | ............. | B81B 7/0016 |
| 2017/0074658 A1* | 3/2017 | Tanaka | ............... | G01C 19/5755 |
| 2017/0088413 A1* | 3/2017 | Tanaka | ............... | B81B 3/001 |
| 2017/0089945 A1* | 3/2017 | Naumann | ............. | G01P 15/125 |
| 2017/0129769 A1 | 5/2017 | Geisberger | | |

FOREIGN PATENT DOCUMENTS

| | | |
|---|---|---|
| JP | 2009-537803 A | 10/2009 |
| JP | 2014-224739 A | 12/2014 |
| JP | 5700652 B2 | 4/2015 |
| JP | 2017-067540 A | 4/2017 |
| WO | WO-03-044539 A1 | 5/2003 |
| WO | WO-2007-131835 A1 | 11/2007 |
| WO | WO-2009-099125 A1 | 8/2009 |

\* cited by examiner

PHYSICAL QUANTITY SENSOR, COMPLEX SENSOR, INERTIAL MEASUREMENT UNIT, PORTABLE ELECTRONIC DEVICE, ELECTRONIC DEVICE, AND VEHICLE

BACKGROUND

1. Technical Field

The present invention relates to a physical quantity sensor, a complex sensor, an inertial measurement unit, a portable electronic device, an electronic device, and a vehicle.

2. Related Art

In recent years, as a method of measuring an acceleration as physical quantity, a physical quantity sensor that is configured according to a rocker lever principle and measures the acceleration from an electrostatic capacitance that changes according to the acceleration applied in a vertical direction is known. For example, in WO03/044539A1, an acceleration sensor (physical quantity sensor) that has a first fixed electrode and a second fixed electrode provided on a substrate, and a movable electrode symmetrically disposed with respect to a center line of a torsion beam, in which one side of the movable electrode is disposed opposite to the first fixed electrode, and the other side thereof is disposed opposite to the second fixed electrode is disclosed. In the acceleration sensor described in WO03/044539A1, a protrusion that prevents an end portion of the movable electrode from coming into contact with the substrate is provided.

The physical quantity sensor described in WO03/044539A1 is provided with a coupling portion that is connected with a rotation shaft (torsion beam) in a direction intersecting with the rotation shaft. A first mass portion (one side of movable electrode) and a second mass portion (the other side of movable electrode) are connected with the coupling portion. However, the first mass portion and the second mass portion of the physical quantity sensor in WO03/044539A1 are connected to each other at the shortest distance. In a case where an excessive acceleration is applied to the physical quantity sensor in the vertical direction, and the mass portions come into contact with a support substrate via a protrusion and receive a strong impact, bending stress thereof is large due to the short coupling portion, and there is a risk of breakage at a boundary between the mass portion and the coupling portion by the strong impact coupling portion.

SUMMARY

An advantage of some aspects of the invention is to solve at least a part of the problems described above, and the invention can be implemented as the following forms or application examples.

Application Example 1

A physical quantity sensor according to this application example includes: a movable body that includes a rotation shaft, a coupling portion that is connected with the rotation shaft and is provided in a direction intersecting with the rotation shaft, and a mass portion that is connected with the coupling portion; a measurement electrode that is provided on a support substrate and is opposed to the mass portion; and a protrusion that is provided in a region where the measurement electrode is provided and protrudes from the support substrate toward the mass portion, in which a length of the coupling portion in the intersecting direction is 1.4 or more times a length from the rotation shaft to the mass portion.

According to this application example, the mass portion of the physical quantity sensor is connected to the rotation shaft and is connected to the coupling portion provided in the intersecting direction that intersects with the rotation shaft. In a case where an acceleration is applied to the physical quantity sensor, the movable body rocks around the rotation shaft. The coupling portion of the application example is extended 1.4 or more times the length from the rotation shaft to the mass portion. A protrusion that protrudes toward the mass portion is provided in the support substrate. According to the configuration, it is possible to reduce the bending stress applied to the coupling portion when an excessive acceleration is applied to the physical quantity sensor and the movable body and the protrusion come into contact with each other. When the length of the coupling portion is set to 1.4 times the length from the rotation shaft to the mass portion, the bending stress applied to the coupling portion is reduced by 0.6 times, and the breakage occurring in the boundary portion between the coupling portion and the mass portion is suppressed. Therefore, it is possible to provide a physical quantity sensor with excellent impact resistance and improved reliability.

Application Example 2

In the physical quantity sensor according to the application example, it is preferable that the movable body has a slit that is formed between the coupling portion and the mass portion, the mass portion has an opening that penetrates in a lattice shape, and an interval between the opening and the slit is wider than an interval between adjacent openings.

According to this application example, since the mass portion has an opening that penetrates in the lattice shape, drag (damping) due to air generated between the mass portion and the support substrate is reduced, and sensitivity for measuring the physical quantity improves. The movable body has a slit that is formed between the coupling portion and the mass portion. In other words, the length of the coupling portion is extended by the slit. Since the interval between the opening and the slit is wider than the interval between the adjacent openings, it is possible to relatively improve rigidity of the coupling portion and the mass portion at the boundary than rigidity of the mass portion.

Application Example 3

In the physical quantity sensor according to the application example, it is preferable that, in a plan view, the coupling portion overlaps the measurement electrode.

According to this application example, the coupling portion overlaps the measurement electrode. The physical quantity sensor obtains an acceleration based on changes in an electrostatic capacitance generated by the measurement electrode and the mass portion opposite to the measurement electrode. Since the coupling portion of the application example overlaps the measurement electrode, the coupling portion has the same function as the mass portion that generates the electrostatic capacitance. Since the generated electrostatic capacitance increases, the sensitivity for measuring the acceleration increases.

Application Example 4

In the physical quantity sensor according to the application example, it is preferable that a support portion that supports the movable body is provided between the rotation shaft and the mass portion, and a width of the slit formed between the support portion and the mass portion is 3 μm or less.

According to this application example, the support portion that supports the movable body is provided between the rotation shaft and the mass portion. The slit is formed between the support portion and the mass portion, and the mass portions rock with respect to the support portion via the rotation shaft by the slit. In the application example, the width of the slit is 3 μm or less. There is a case that the mass portion may be displaced in a plane of the mass portion when the mass portion rocks (out-of-plane displacement) around the rotation shaft. Since the slit does not disturb the in-plane displacement generated when the mass portion rocks (out-of-plane displacement) around the rotation shaft, accuracy for measuring the acceleration improves. When strong impact is applied in an in-plane direction, the slit becomes a stopper that can reduce excessive displacement in plane, and since the in-plane displacement of the mass portion is suppressed to 3 μm or less, it is possible to realize a physical quantity sensor with high reliability.

Application Example 5

In the physical quantity sensor according to the application example, it is preferable that the width of the slit formed between the coupling portion and the mass portion is 3 μm or less.

According to this application example, the width of the slit between the coupling portion and the mass portion is 3 μm or less. In a case where the mass portion performs in-plane displacement of 3 um or more in a direction approaching the coupling portion, the mass portion comes into contact with the coupling portion by the displacement, and the in-plane displacement of the mass portion is suppressed to 3 um or less. Accordingly, it is possible to prevent breakage of the mass portion and the coupling portion that come into contact with each other, and realize a physical quantity sensor with high reliability.

Application Example 6

In the physical quantity sensor according to the application example, it is preferable that a plurality of the protrusions are provided in a straight line parallel to the rotation shaft.

According to this application example, a plurality of the protrusions protruding from the support substrate toward the mass portion are provided in a straight line parallel to the rotation shaft. Accordingly, it is possible to distribute the impact received when the movable body and the protrusion come into contact with each other. It is also possible to stabilize an attitude of the movable body at the time of the contact.

Application Example 7

A complex sensor according to this application example includes: the physical quantity sensor according to the above-described application example and an angular velocity sensor element.

According to this application example, the complex sensor can be easily configured, and for example, acceleration data and angular velocity data may be obtained.

Application Example 8

An inertial measurement unit according to this application example includes: the physical quantity sensor according to any one of the above-described application examples; an angular velocity sensor; and a control unit that controls the physical quantity sensor and the angular velocity sensor.

According to this application example, it is possible to provide an inertial measurement unit with higher reliability by the physical quantity sensor with improved impact resistance.

Application Example 9

A portable electronic device according to this application example includes: the physical quantity sensor according to any one of the above-described application examples; a case in which the physical quantity sensor is stored; a processing unit that is stored in the case and processes output data from the physical quantity sensor; a display portion that is stored in the case; and a light-transmissive cover that covers an opening portion of the case.

According to this application example, it is possible to provide a portable electronic device with higher control reliability by the output data of the physical quantity sensor with improved impact resistance.

Application Example 10

An electronic device according to this application example includes: the physical quantity sensor according to the above-described application example; and a control unit that performs control based on a measurement signal output from the physical quantity sensor.

According to this application example, it is possible to provide an electronic device provided with the physical quantity sensor with improved reliability and sensitivity for measuring the physical quantity.

Application Example 11

A vehicle according to this application example includes: the physical quantity sensor according to the above-described application example; and a control unit that performs control based on a measurement signal output from the physical quantity sensor.

According to this application example, it is possible to provide a vehicle that is provided with the physical quantity sensor with improved reliability and sensitivity for measuring the physical quantity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to drawings. In the following drawings, the scale of each layer and each member is made different from the actual scale in order to make each layer and each member size recognizable.

In FIGS. 1, 2, 7 to 10, and 12 to 16, three axes of an X axis, a Y axis, and a Z axis orthogonal to each other are illustrated, and a leading end side of an arrow illustrating an axial direction is a "+side", and a base end side thereof is a "–side", for the sake of explanation. Hereinafter, a direction parallel to the X axis is referred to as an "X axis direction", a direction parallel to the Y axis is referred to as a "Y axis direction", and a direction parallel to the Z axis is referred to as a "Z axis direction".

Embodiment

Configuration of Physical Quantity Sensor

Figure 1:
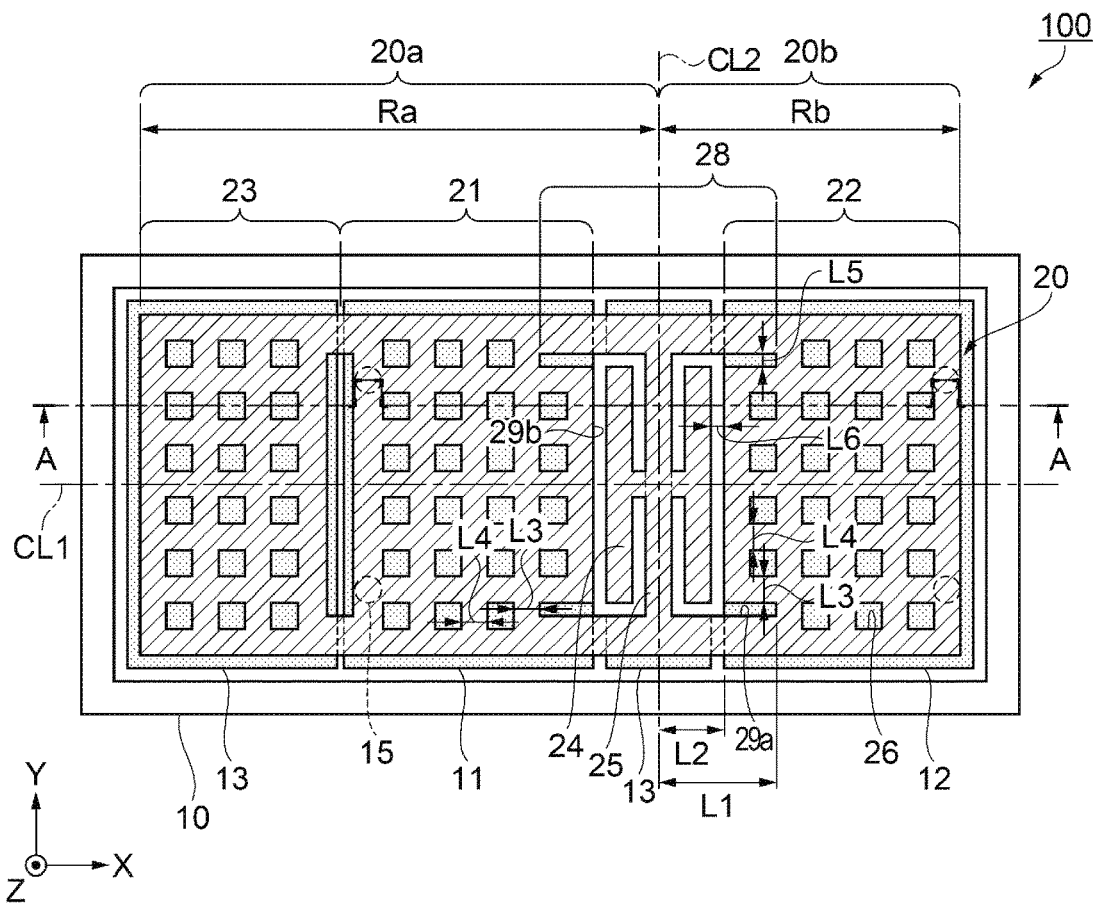
FIG. 1 is a plane view schematically illustrating a physical quantity sensor according to an embodiment.
Figure 2:
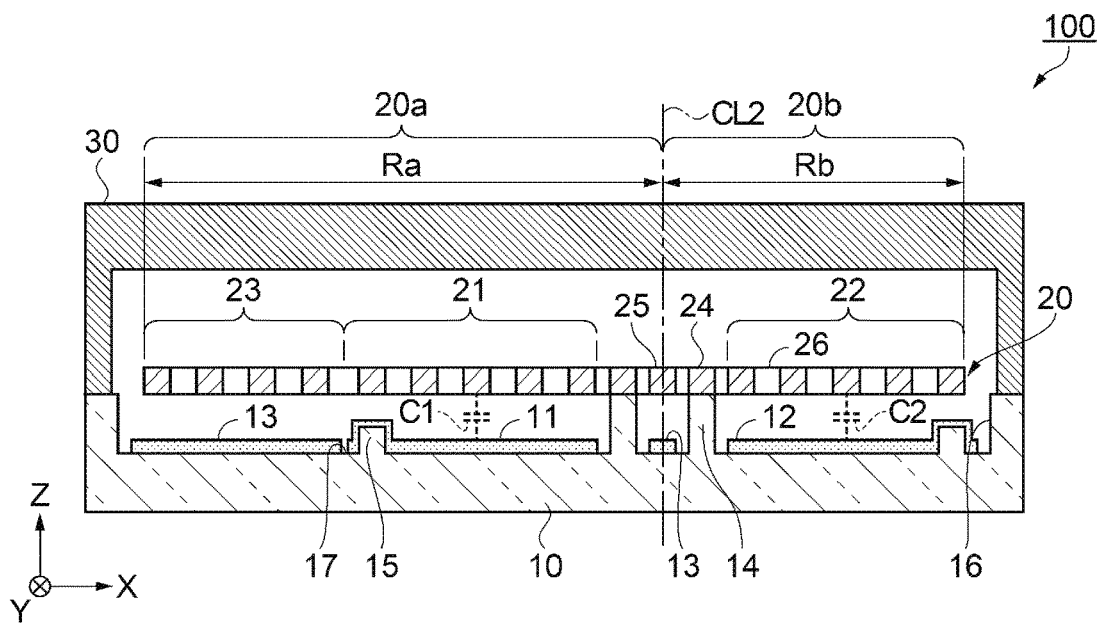
FIG. 2 is a sectional view taken along line A-A in FIG. 1.

FIG. 1 is a plan view schematically illustrating a physical quantity sensor according to an embodiment. FIG. 2 is a sectional view taken along line A-A in FIG. 1. First, a schematic configuration of a physical quantity sensor 100 according to an embodiment will be described with reference to FIGS. 1 and 2. In FIG. 1, for the sake of explanation, an illustration of a lid 30 is omitted.

The physical quantity sensor 100 of the present embodiment can be used as, for example, an inertial sensor. Specifically, for example, it is possible to use the physical quantity sensor 100 as an acceleration sensor (electrostatic capacitance type acceleration sensor, electrostatic capacitance type MEMS acceleration sensor) for measuring an acceleration in a vertical direction (Z axis direction). In the present embodiment, the vertical direction is referred to as the Z axis, an axis direction of the rotation shaft (beam portion 25) described later as the Y axis, and a direction intersecting with both the Z axis and the Y axis as the X axis.

As illustrated in FIGS. 1 and 2, the physical quantity sensor 100 includes a flat plate shape movable body 20, a support substrate 10 that supports the movable body 20, and the lid 30 that contains the movable body 20 with the support substrate 10.

The support substrate 10 has a concave cavity 16. On a main surface 17 in the cavity 16, first and second fixed electrodes 11 and 12 as a measurement electrode, a dummy electrode 13 and protrusions 15 are provided. A support column 14 that supports the movable body 20 with an interval therebetween is provided between the first fixed electrode 11 and the second fixed electrode 12. The protrusion 15 that protrudes toward the movable body 20 side (+Z axis side) is provided on both sides of the support column 14 in the X axis direction. The support column 14 and the protrusion 15 are formed integrally with the support substrate 10. The material of the support substrate 10 is not particularly limited, but in the present embodiment, as a preferred example, borosilicate glass (hereinafter, glass) that is an insulating material is adopted.

The first and second fixed electrodes 11 and 12 are provided on the support substrate 10. Specifically, the first fixed electrode 11 is positioned in a –X axis side of the support column 14 in a side plan view from the Y axis direction, and is provided in a region that is opposed to and overlaps a first mass portion 21 described later in a plan view from the Z axis direction. The second fixed electrode 12 is positioned in the +X axis side of the support column 14 in the side plan view from the Y axis direction, and is provided in a region that is opposed to and overlaps the second mass portion 22 described later in a plan view from the Z axis direction. The dummy electrode 13 is provided on the main surface 17 other than the first and second fixed electrodes 11 and 12. As a material of the first and second fixed electrodes 11 and 12 and the dummy electrode 13, for example, a conductive film such as Pt (platinum), Al (aluminum), Mo (molybdenum), Cr (chromium), Ti (titanium), Ni (nickel), Cu (copper), Ag (silver), Au (gold), or, ITO (Indium Tin Oxide) can be applied.

The physical quantity sensor 100 includes the protrusion 15 that limits a displacement of the movable body 20 on the main surface 17 of the support substrate 10 to prevent the displaced (rocking) movable body 20 and the support substrate 10 from coming into contact with each other when an excessive acceleration is applied. The protrusions 15 are provided in a region that the first fixed electrode 11 is provided and a region that the second fixed electrode 12 is provided, and protrude from the support substrate 10 toward the first and second mass portions 21 and 22. The protrusion 15 has a cylindrical shape and diameter thereof is approximately 3 to 5 μm. Since the displacement of the movable body 20 is suppressed by the protrusion 15, collision energy when the movable body 20 and the protrusion 15 collide is smaller than the collision energy when an end portion of the movable body 20 collides with the support substrate 10. Accordingly, since the impact resistance of the movable body 20 improves, it is possible to suppress breakage of the movable body 20.

A plurality of the protrusions 15 (2 each) are provided on the first fixed electrode 11 that overlaps the first mass portion 21 and the second fixed electrode 12 that overlaps the second mass portion 22. The plurality of protrusions 15 are provided in a straight line parallel to the beam portion 25 as a rotation shaft. The protrusion 15 is provided at a line symmetry position with respect to a center line CL1 that divides the movable body 20 into two in an axial line direction (Y axis direction) of the beam portion 25. Accordingly, it is possible to distribute impact received when the movable body 20 and the protrusion 15 come into contact with each other. It is also possible to stabilize an attitude of the movable body 20 at the time of the contact. In the present embodiment, a configuration that two protrusions 15 are provided in each region in which the first and second fixed electrodes 11 and 12 is provided is illustrated but the configuration is not limited to this. A configuration in which one protrusion 15 is provided in each region or a configuration in which three or more protrusions are provided in each region may be applied. The shape of the protrusion 15 is described as a cylindrical shape, but it may be a polygonal prism such as a triangular prism or square pillar, or a shape that the upper surface thereof is chamfered. A protective film with insulating property may be formed on the surface of the protrusion 15. Accordingly, it is possible to prevent electrical short circuit when the first and second mass portions 21 and 22 and the protrusion 15 come into contact with each other.

The movable body 20 includes a support portion 24 and the beam portion 25 as a rotation shaft. The support portion 24 is fixed to the support column 14 and is coupled with the support substrate 10. The support portion 24 has a rectangle shape long in the Y axis direction, and two of the support portions 24 are provided in parallel with the beam portion 25 interposed in between. The two support portions 24 are coupled in the middle. The beam portion 25 is supported with the support portion 24 and extends from a center of the support portion 24 in the Y axis direction. The beam portion 25 has a function as a so-called torsion spring. The beam portion 25 rockably supports the entire movable body 20 with respect to the support substrate 10 via the support portion 24 and the support column 14.

The movable body 20 has a first movable body 20a and a second movable body 20b. The first movable body 20a is a region on a –X axis direction side from a center line CL2 as a rotational center of the beam portion 25, and the second movable body 20b is a region on a +X axis direction side from the center line CL2 as a rotational center of the beam portion 25. In the first movable body 20a, the first mass portion 21 and a third mass portion 23 are provided in series from the beam portion 25 toward the –X axis direction. The second mass portion 22 is provided in the second movable body 20b. In the plan view from the Z axis direction, the first mass portion 21 is positioned at a region overlapping the first fixed electrode 11, and the second mass portion 22 is positioned at a region overlapping the second fixed electrode 12.

The movable body 20 is supported with the beam portion 25 and can rock around the beam portion 25 as a rotation shaft. As the movable body 20 rocks (tilts) in a seesaw manner with the beam portion 25 as a support point, the gap (distance) between the first mass portion 21 and the first fixed electrode 11 and the gap (distance) between the second mass portion 22 and the second fixed electrode 12 change. The physical quantity sensor 100 obtains an acceleration from the changes in electrostatic capacitances C1 and C2 generated between the first mass portion 21 and the first fixed electrode 11 and between the second mass portion 22 and the second fixed electrode 12 according to the tilting of the movable body 20.

Specifically, in a case where an acceleration (for example, a gravitational acceleration) is applied to the movable body 20 in the vertical direction (Z axis direction), a rotational moment (moment of force) is generated in each of the first movable body 20a and the second movable body 20b. Here, in a case where a rotational moment of the first movable body 20a (for example, counterclockwise rotational moment) and a rotational moment of the second movable body 20b (for example, clockwise rotational moment) are balanced, no change occurs in the tilt of the movable body 20, and thereby the acceleration cannot be measured. Therefore, the movable body 20 is designed in a manner that when the acceleration is applied in the vertical direction, the rotational moment of the first movable body 20a and the rotational moment of the second movable body 20b are not balanced, so that a predetermined tilt is generated in the movable body 20.

The physical quantity sensor 100 is disposed at a position that the beam portion 25 is deviated from the center of gravity of the movable body 20 in the X axis direction. In other words, since the third mass portion 23 is provided in the first movable body 20a, a distance Ra from the center line CL2 as a rotation shaft of the beam portion 25 to an end surface of the first movable body 20a and a distance Rb from the center line CL2 to an end surface of the second movable body 20b are different. Accordingly, the first movable body 20a and the second movable body 20b have different masses from each other. That is, the movable body 20 has different mass on one side (first movable body 20a) and the other side (second movable body 20b) with the center line CL2 of the beam portion 25 as an origin. By differentiating the masses of the first movable body 20a and the second movable body 20b, it is possible to unbalance the rotational moment of the first movable body 20a and the rotational moment of the second movable body 20b generated when an acceleration is applied to the movable body 20 in the vertical direction. Accordingly, when an acceleration is applied to the physical quantity sensor 100 in the vertical direction, the movable body 20 is tilted.

The electrostatic capacitance (changeable electrostatic capacitance) C1 is constituted between the first mass portion 21 and the first fixed electrode 11. The electrostatic capacitance (changeable electrostatic capacitance) C2 is constituted between the second mass portion 22 and the second fixed electrode 12. The electrostatic capacitance C1 changes its electrostatic capacitance in accordance with the gap (distance) between the first mass portion 21 and the first fixed electrode 11, and the electrostatic capacitance C2 changes its electrostatic capacitance in accordance with the gap (distance) between the second mass portion 22 and the second fixed electrode 12.

For example, in a case where the movable body 20 is horizontal with respect to the support substrate 10, the electrostatic capacitance C1 and C2 becomes an electrostatic capacitance value approximately equal to each other. Specifically, since the overlapping area of the first mass portion 21 and the first fixed electrode 11 and the overlapping area of the second mass portion 22 and the second fixed electrode 12 are equal in the plan view from the Z axis direction and the gap between the first mass portion 21 and the first fixed electrode 11 and the gap between the second mass portion 22 and the second fixed electrode 12 in the side surface view from the Y direction are not equal, the electrostatic capacitance values of the electrostatic capacitance C1 and C2 are not equal. For example, when an acceleration is applied to the movable body 20 in the vertical direction and the movable body 20 tilts around the beam portion 25 as a rotation shaft, the electrostatic capacitance values of the electrostatic capacitance C1 and C2 change according to the tilting of the movable body 20 in the electrostatic capacitance C1 and C2. In a case where the movable body 20 is tilted, since the gap between the first mass portion 21 and the first fixed electrode 11 and the gap between the second mass portion 22 and the second fixed electrode 12 are different, the electrostatic capacitance values of the electrostatic capacitance C1 and C2 differ.

When an acceleration is applied to the movable body 20 in the vertical direction and the movable body 20 rocks, a plurality of openings 26 that penetrates the movable body 20 in a thickness direction are provided in the movable body 20 in order to reduce damping caused by viscosity of gas (function to stop the movement of the movable body, flow resistance). The first to third mass portions 21, 22, and 23 of the present embodiment have the square openings 26 penetrating in a lattice shape. Accordingly, the damping of the movable body 20 reduces and the sensitivity for measuring the acceleration improves. The plurality of openings 26 may have different shapes individually. The position and the number of the openings 26 can be freely set.

The movable body 20 includes a coupling portion 28. The coupling portion 28 is connected with the beam portion 25 as a rotation shaft, and is provided in an intersecting direction (X axis direction) intersecting with the beam portion 25. The coupling portion 28 is connected with the first mass portion 21 and the second mass portion 22. That is, the coupling portion 28 extends from the beam portion 25 in both directions of the X axis direction and is connected to the first mass portion 21 and the second mass portion 22.

The movable body 20 has a slit 29a formed between the coupling portion 28 and the first mass portion 21 and between the coupling portion 28 and the second mass portion 22. The slits 29a extend from the support portion 24 in the X axis direction. That is, the length of the coupling portion 28 of the present embodiment is extended in both directions of the X axis direction by the slits 29a and the long side of the movable body 20 in the Y axis direction.

The coupling portion 28 overlaps the first and second fixed electrodes 11 and 12 as a measurement electrode in the plan view. Specifically, in the coupling portion 28, the region extending in the X axis direction by the slits 29a is a region used as a part of the first mass portion 21 or the second mass portion 22 in the related art, and overlaps the first and second fixed electrodes 11 and 12. That is, the extended region of the coupling portion 28 has a function as an electrode (first and second mass portions 21 and 22) that generates an electrostatic capacitance between the first and second fixed electrodes 11 and 12, and a function that extends the length connecting the first mass portion 21 and the second mass portion 22. Since the coupling portion 28 overlaps the first and second electrodes 11 and 12, the electrostatic capacitance C1 and C2 generated between the first movable body 20a and the first fixed electrode, and between the first movable body 20b and the second fixed electrode become large and thereby the sensitivity for measuring the acceleration improves.

An interval L3 between the opening 26 provided in the first and second mass portions 21 and 22 and the slits 29a that extend the coupling portion 28 is wider than an interval L4 between the adjacent openings 26. Accordingly, the rigidity of the coupling portion 28 and the first and second mass portions 21 and 22 at the boundary relatively increases than the rigidity of the first and second mass portions 21 and 22, it is possible to suppress breakage occurring at the boundary of the coupling portion 28 and the first and second mass portions 21 and 22.

A width L6 formed between the support portion 24 provided between the beam portion 25 and the first and second mass portions 21 and 22, and slits 29b formed between the first and second mass portions 21 and 22 is 3 μm or less. The first and second mass portions 21 and 22 are divided by the slits 29b from the support portion 24. When rocking (out-of-plane displacement) the first and second mass portions 21 and 22 around the beam portion 25, there is a case that displacement (in-plane displacement) along the plane of the first and second mass portions 21 and 22 may occur. Since the slits 29b do not disturb in-plane displacement generated when the first and second mass portions 21 and 22 rock (out-of-plane displacement) around the beam portion 25, accuracy for measuring the acceleration improves. When strong impact is applied in an in-plane direction, the slits 29b become a stopper that can reduce excessive displacement in plane, and since the in-plane displacement of the first and second mass portions 21 and 22 is suppressed to 3 μm or less, it is possible to realize a physical quantity sensor 100 with high reliability.

The slits 29a are formed between the coupling portion 28 and the first and second mass portions 21 and 22. In the present embodiment, the width L6 of the above-described slits 29b and a width L5 of the slits 29a are configured to be equal to each other. Since the width L5 of the slits 29a between the coupling portion 28 and the first and second mass portions 21 and 22 is 3 μm or less, in a case where the first and second mass portions 21 and 22 are in-plane displaced 3 μm or more in a direction approaching the coupling portion 28, the first and second mass portions 21 and 22 come into contact with the coupling portion 28 by the displacement, and the in-plane displacement of the first and second mass portions 21 and 22 is suppressed to 3 μm or less. Accordingly, it is possible to prevent the breakage of the first and second mass portions 21 and 22 contacting with the coupling portion 28, it is possible to realize the physical quantity sensor 100 with high reliability.

The material of such a movable body 20 is not particularly limited, but in the present embodiment, as a preferred example, silicon which is a conductive material is adopted. By using a conductive material in the movable body 20, it is possible to impart a function as an electrode to the first mass portion 21 that is a region overlapping the first fixed electrode 11 and the second mass portion 22 that is a region overlapping the second fixed electrode 12. The first and second mass portions may be formed of a conductive electrode layer provided on a nonconductive substrate using a nonconductive substrate to the movable body.

Figure 3:
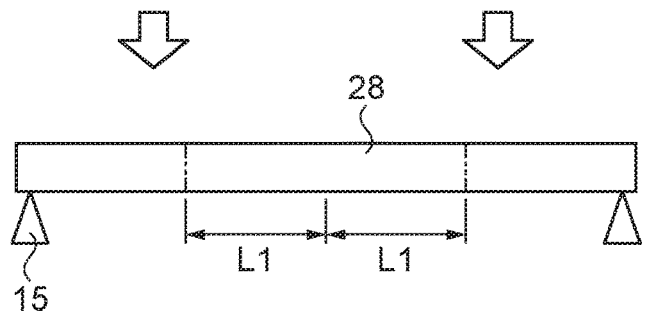
FIG. 3 is a view illustrating a beam loaded model for calculating bending stress applied to a movable body.
Figure 4:
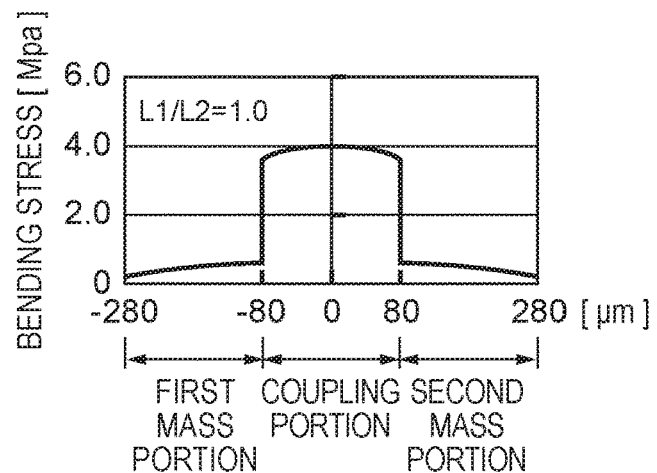
FIG. 4 is a graph illustrating calculation results of the bending stress applied to the movable body.
Figure 5:
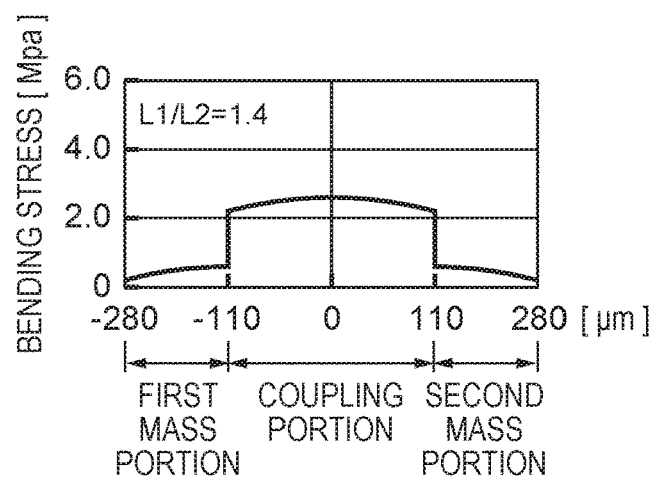
FIG. 5 is a graph illustrating calculation results of the bending stress applied to the movable body.
Figure 6:
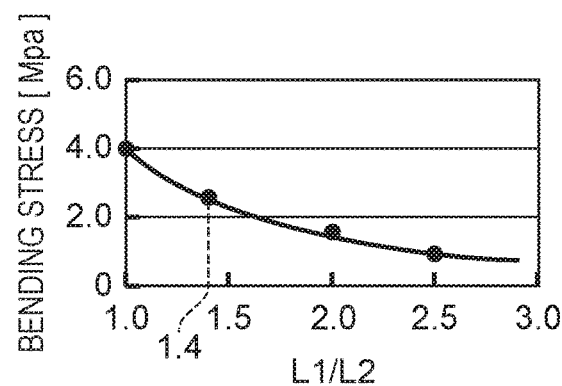
FIG. 6 is a graph illustrating a relationship between a length of a coupling portion and bending stress.

FIG. 3 is a view illustrating a beam loaded model for calculating bending stress applied to a movable body. FIGS. 4 and 5 are graphs illustrating calculation results of the bending stress applied to the movable body. FIG. 6 is a graph illustrating a relationship between a length of a coupling portion and bending stress.

Figure 26:
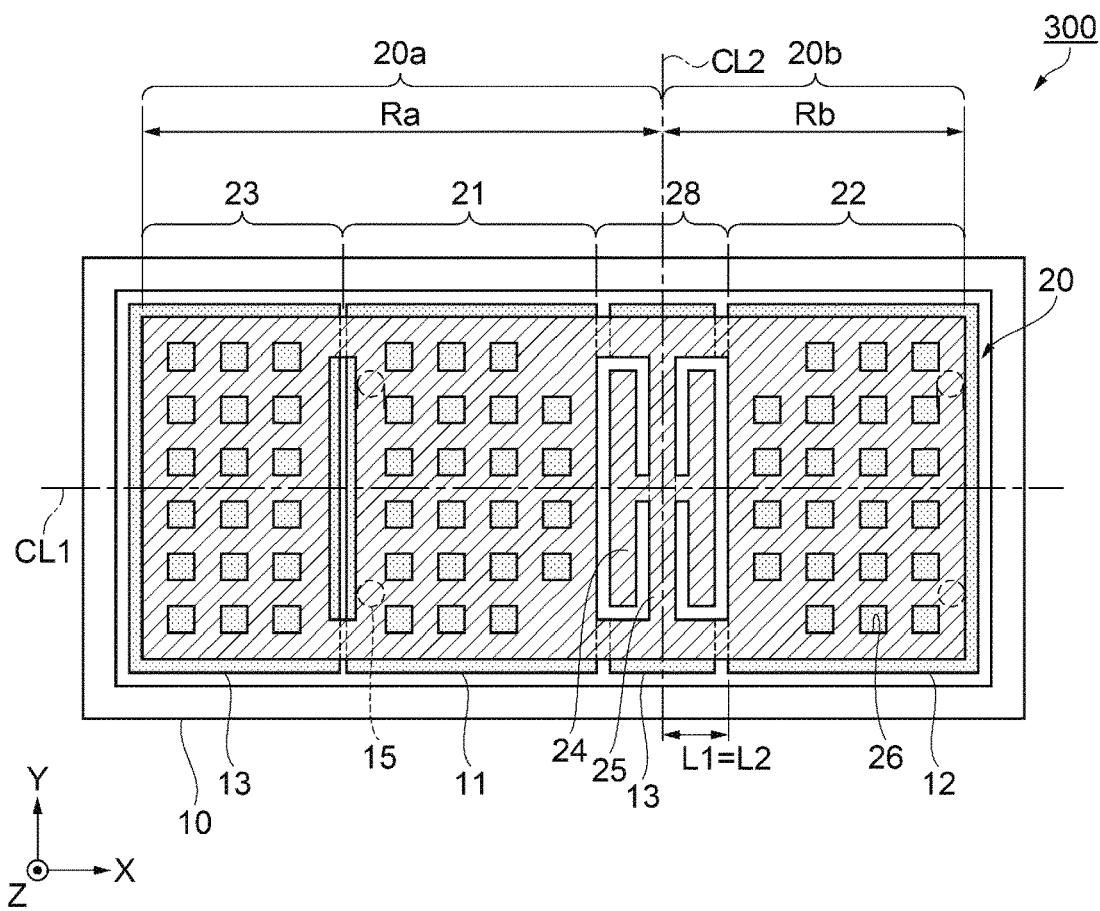
FIG. 26 is a plan view schematically illustrating a physical quantity sensor of related art.

Next, the bending stress that the movable body 20 receives when excessive impact is applied to the physical quantity sensor 100 in the vertical direction will be described. FIG. 26 is a plan view schematically illustrating a physical quantity sensor of related art.

As illustrated in FIG. 3, in the state when large impact is applied to the physical quantity sensor 100 in the vertical direction, the protrusion 15 serves as a support point in a case where the support portion 24, the beam portion 25, and the third mass portion 23 are ignored, and the state is considered equivalent to a distributed load beam model having different supports at both ends. The position of the protrusion 15 was fixed to calculate bending stress when a length L1 of the coupling portion 28 was changed. The length L1 of the coupling portion 28 is a unidirectional length of the coupling portion 28 extending from a rotation shaft center of the beam portion 25 in both directions of the X axis direction. In the description below, the length L1 of the coupling portion 28 may be indicated as a ratio (L1/L2) of the length L1 to a length L2 from the beam portion 25 to the first mass portion 21 or the second mass portion 22. The entire length obtained by adding the length of the first and second mass portions 21 and 22 to the coupling portion 28 as a beam model for calculation is 560 µm. The width of the coupling portion 28 is approximately 25 µm, and the thickness of each portion in the Z axis direction is approximately 30 µm.

The bending stress calculation results illustrated in FIG. 4 are the results obtained when the length L1 of the coupling portion 28 is equal to the length L2 from the beam portion 25 to the first and second mass portions 21 and 22 (L1/L2=1.0). That is, the results illustrated in FIG. 26 are based on a physical quantity sensor 300 of the related art. In the physical quantity sensor 300 of the related art, the slits 29a (See FIG. 1) that extend the coupling portion 28 was not provided. Therefore, the length L1 of the coupling portion 28 and the length L2 from the beam portion 25 to the first mass portion 21 or the second mass portion 22 were equal.

The bending stress calculation results illustrated in FIG. 5 are the results obtained when the length L1 of the coupling portion 28 is longer than the length L2 from the beam portion 25 to the first and second mass portions 21 and 22 (L1/L2=1.4). This corresponds to the physical quantity sensor 100 of the present embodiment illustrated in FIG. 1.

The horizontal axis of FIGS. 4 and 5 indicates a distance from the center of the coupling portion 28 that corresponds to the beam portion 25 in the beam model illustrated in FIG. 3. The vertical axes of FIGS. 4 and 5 indicates the bending stress generated in each portion of the beam model when a load of 4,500 G is applied in the vertical direction in the beam model illustrated in FIG. 3. As is known from the comparison between FIG. 4 and FIG. 5, the bending stress applied to the coupling portion 28 is reduced from 4.0 Mpa to 2.4 Mpa by extending the length of the coupling portion 28 from L1/L2=1.0 to L1/L2=1.4, that is, changing from the shape of the related art illustrated in FIG. 26 to the shape of the present embodiment illustrated in FIG. 1. The load of 4,500 G corresponds to the maximum impact when the movable body 20 and the protrusion 15 collide with application of an excessive acceleration to the physical quantity sensor 100.

The horizontal axis of FIG. 6 indicates the length of the coupling portion 28 in a ratio of L1/L2. The vertical axis of FIG. 6 indicates the maximum bending stress applied to the coupling portion 28 of the beam model. As is known from FIG. 6, as the length L1 of the coupling portion 28 extends, the bending stress applied to the coupling portion 28 decreases. The inventors made samples of the coupling portions 28 having different lengths, and as a result of carrying out an impact resistance test, no breakages occurred in the samples in which the length of the coupling portion 28 is set to L1/L2=1.4 or higher. Therefore, in the physical quantity sensor 100 of the present embodiment, the length of the coupling portion 28 was extended to L1/L2=1.4. Accordingly, it is possible to suppress the breakage at the boundary portion between the coupling portion 28 and the first and second mass portions 21 and 22. In the physical quantity sensor 100 in which a total length of the coupling portion 28 and the first and second mass portions 21 and 22 is 560 µm, the maximum extendable length L1 of the coupling portion 28 is approximately 2.7 times L2.

FIGS. 7 to 10 are sectional views schematically illustrating operation of the physical quantity sensor. The relationship between the operation of the physical quantity sensor 100 and the electrostatic capacitance will be described with reference to FIGS. 7 to 10. In FIGS. 7 to 10, illustration of configurations not necessary for explanation of the operation is omitted.

Figure 7:
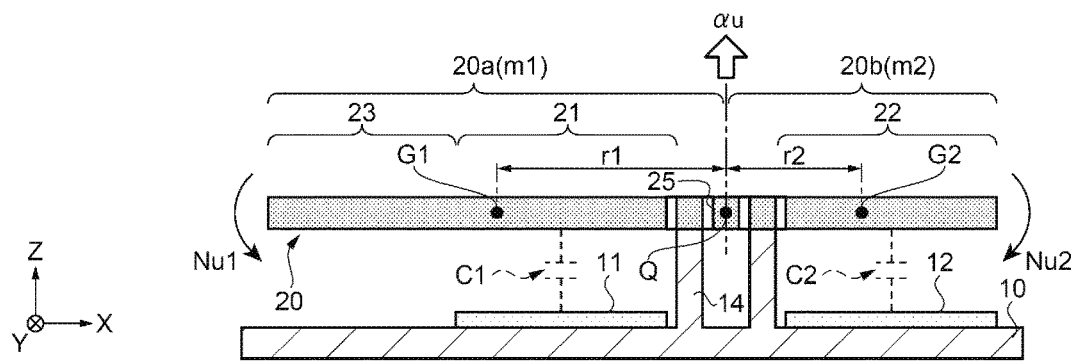
FIG. 7 is a sectional view schematically illustrating operation of the physical quantity sensor.

FIG. 7 illustrates a state in which the movable body 20 is positioned in a substantially horizontal state with respect to the support substrate 10. A case where an acceleration αu in the +Z axis direction is applied to the physical quantity sensor 100 in this state will be described.

The movable body 20 has a flat plate-like rectangular shape having a uniform thickness (dimension in the Z axis direction). The first movable body 20a has a mass m1 and its center of gravity G1 is positioned at a distance r1 in the −X axis direction from the center Q of the beam portion 25 rotatably supported by the support portion 24. The second movable body 20b has a mass m2, and its center of gravity G2 is positioned at a distance r2 in the +X axis direction from the center Q of the beam portion 25. The first movable body 20a has the third mass portion 23 and has a rectangular shape longer than the second movable body 20b in the X axis direction. Therefore, the mass m1 of the first movable body 20a is heavier than the mass m2 of the second movable body 20b, and the distance r1 where the center of gravity G1 of the first movable body 20a is positioned is longer than the distance r2 where the center of gravity G2 of the second movable body 20b is positioned.

When the acceleration αu directed from the −Z axis direction to the +Z axis direction is applied to the physical quantity sensor 100, a first rotational moment Nu1 corresponding to the product of the mass m1, the acceleration αu, and the distance r1 acts on the first movable body 20a in a counterclockwise direction around the center Q of the beam portion 25 as a rotation shaft. On the other hand, the second rotational moment Nu2 corresponding to the product of the mass m2, the acceleration αu, and the distance r2 acts on the second movable body 20b in a clockwise direction around the center Q of the beam portion 25 as a rotation shaft. Since the mass m1 of the first movable body 20a is heavier than the mass m2 of the second movable body 20b and the distance r1 where the center of gravity G1 of the first movable body 20a is positioned is longer than the distance r2 where the center of gravity G2 of the second movable body 20b is positioned, the first rotational moment Nu1 acting on the first movable body 20a is larger than the second rotational moment Nu2 acting on the second movable body 20b.

Figure 8:
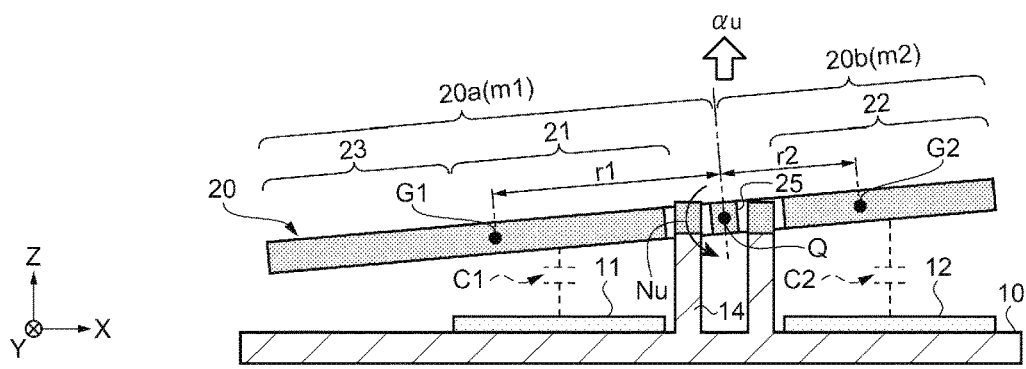
FIG. 8 is a sectional view schematically illustrating operation of the physical quantity sensor.

Accordingly, as illustrated in FIG. 8, a torque Nu corresponding to the difference between the first rotational moment Nu1 (see FIG. 7) and the second rotational moment Nu2 (see FIG. 7) acts on the beam portion 25 in a counterclockwise direction around the center Q of the beam portion 25 as a rotation shaft, and the movable body 20 is tilted counterclockwise. The gap between the first mass portion 21 of the first movable body 20a and the first fixed electrode 11 becomes small (narrow), and the electrostatic capacitance value of the electrostatic capacitance C1 formed between the first mass portion 21 and the first fixed electrode 11 increases. On the other hand, the gap between the second mass portion 22 of the second movable body 20b and the second fixed electrode 12 becomes large (wider), and the electrostatic capacitance value of the electrostatic capacitance C2 formed between the second mass portion 22 and the second fixed electrode 12 decreases.

Figure 9:
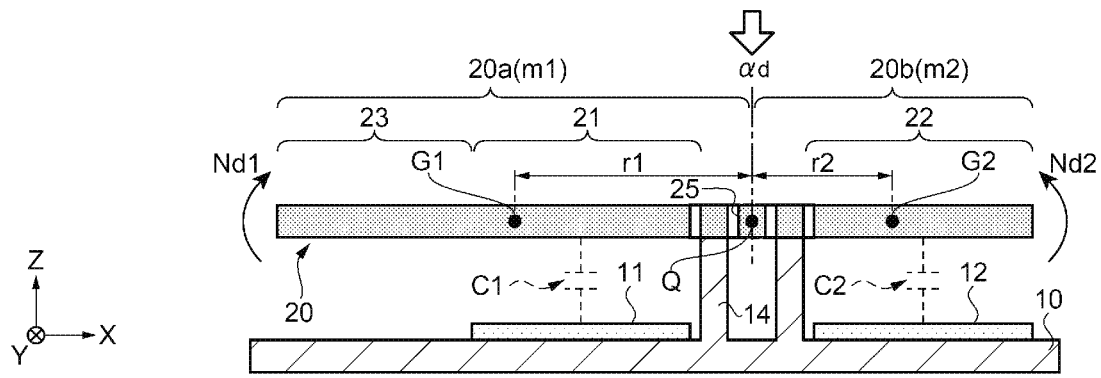
FIG. 9 is a sectional view schematically illustrating operation of the physical quantity sensor.

FIG. 9 illustrates a state in which the movable body 20 is positioned in a substantially horizontal state with respect to the support substrate 10. A case where an acceleration αd in the −Z axis direction is applied to the physical quantity sensor 100 in this state will be described.

When the acceleration αd directed from the +Z axis direction to the −Z axis direction is applied to the physical quantity sensor 100, a first rotational moment Nd1 corresponding to the product of the mass m1, the acceleration ad, and the distance r1 acts on the first movable body 20a in a clockwise direction around the center Q of the beam portion 25 as a rotation shaft. On the other hand, the second rotational moment Nd2 corresponding to the product of the mass m2, the acceleration αd, and the distance r2 acts on the second movable body 20b in a counterclockwise direction around the center Q of the beam portion 25 as a rotation shaft. Since the mass m1 of the first movable body 20a is heavier than the mass m2 of the second movable body 20b and the distance r1 where the center of gravity G1 of the first movable body 20a is positioned is longer than the distance r2 where the center of gravity G2 of the second movable body 20b is positioned, the first rotational moment Nd1 acting on the first movable body 20a is larger than the second rotational moment Nd2 acting on the second movable body 20b.

Figure 10:
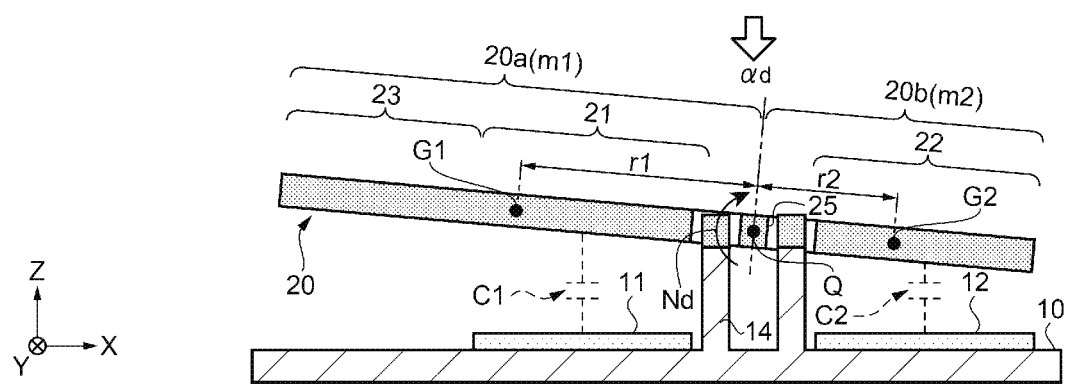
FIG. 10 is a sectional view schematically illustrating operation of the physical quantity sensor.

Accordingly, as illustrated in FIG. 10, a torque Nd corresponding to the difference between the first rotational moment Nd1 (see FIG. 9) and the second rotational moment Nd2 (see FIG. 9) acts on the beam portion 25 in a clockwise direction around the center Q of the beam portion 25 as a rotation shaft, and the movable body 20 is tilted clockwise. The gap between the first mass portion 21 of the first movable body 20a and the first fixed electrode 11 becomes large (wider), and the electrostatic capacitance value of the electrostatic capacitance C1 formed between the first mass portion 21 and the first fixed electrode 11 decreases. On the other hand, the gap between the second mass portion 22 of the second movable body 20b and the second fixed electrode 12 becomes small (narrow), and the electrostatic capacitance value of the electrostatic capacitance C2 formed between the second mass portion 22 and the second fixed electrode 12 increases.

In the physical quantity sensor 100, by increasing the torques Nu and Nd acting on the beam portion 25, that is, by enlarging the difference in mass between the first movable body 20a and the second movable body 20b, the movable body 20 can be largely tilted by enlarging the difference between the distance r1 from the beam portion 25 to the center of gravity G1 of the first movable body 20a and the distance r2 from the beam portion 25 to the center of gravity G2 of the second movable body 20b. Accordingly, since the increase and decrease in the capacitance values of the electrostatic capacitances C1 and C2 becomes large, it is possible to improve the sensitivity for measuring the physical quantity of the physical quantity sensor 100. The physical quantity sensor 100 can increase the tilting of the movable body 20 by narrowing the width of the beam portion 25 functioning as a torsion spring in the X axis direction and lowering the toughness of the spring. Thereby, it is possible to increase the sensitivity for measuring the physical quantity.

In the present embodiment, the movable body 20 is described as being provided so as to be rockable by the beam portion 25 supported via the support column 14 or the like provided on the support substrate 10, but it is not limited to this configuration. For example, the movable body may be configured to be rockable by a beam portion extending from a frame-like support body that surrounds the outer periphery of the movable body and is provided at a predetermined interval from the movable body in the Y axis direction in plan view from the Z axis direction.

Manufacturing Method of Physical Quantity Sensor

Figure 11:
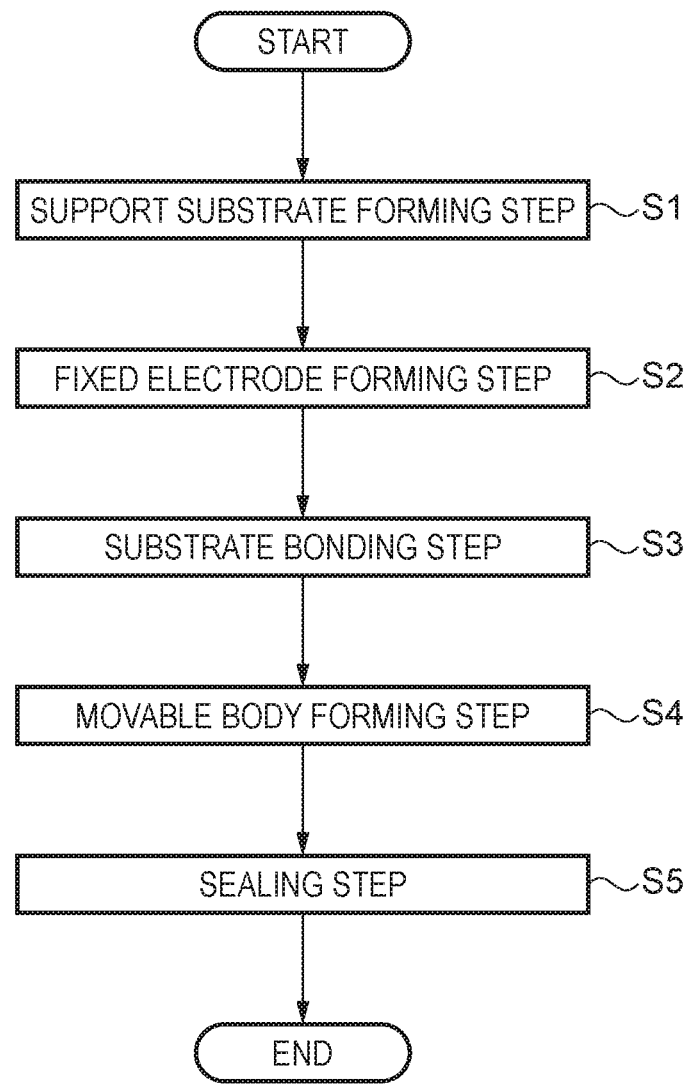
FIG. 11 is a flowchart explaining a manufacturing process of the physical quantity sensor.

FIG. 11 is a flowchart explaining a manufacturing process of the physical quantity sensor. FIGS. 12 to 16 are sectional views of the physical quantity sensor in each manufacturing process. Next, the manufacturing method of the physical quantity sensor 100 will be described with reference to FIGS. 11 to 16.

Figure 12:
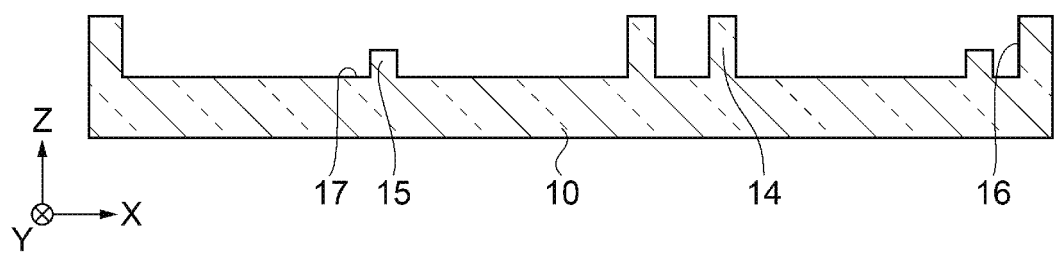
FIG. 12 is a sectional view of the physical quantity sensor in each manufacturing process.

Step S1 is a support substrate forming step of forming the support substrate 10 and the protrusion 15. First, a glass substrate is prepared. In the support substrate forming step, the support substrate 10 and the protrusions 15 are formed by patterning the glass substrate using a photolithography technique and an etching technique. For example, the glass substrate can be wet-etched by using a hydrofluoric acid based etchant. Thereby, it is possible to obtain the support substrate 10 having the concave cavity 16, the support column 14 and the protrusion 15 formed on the glass substrate as illustrated in FIG. 12.

Figure 13:
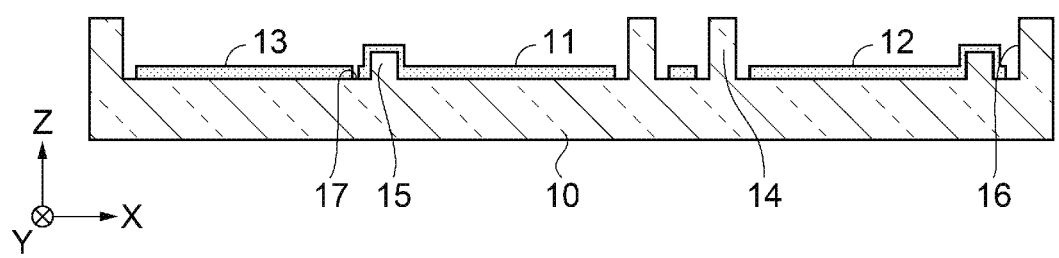
FIG. 13 is a sectional view of the physical quantity sensor in each manufacturing process.

Step S2 is a fixed electrode forming step for forming the first and second fixed electrodes 11 and 12 and the dummy electrode 13. In the fixed electrode forming step, a conductive film is formed on the main surface 17 of the support substrate 10 by a sputtering method or the like, and then the conductive film is patterned using a photolithography technique and an etching technique (dry etching, wet etching, or the like) to form the first and second fixed electrodes 11 and 12 and the dummy electrode 13. Thereby, as illustrated in FIG. 13, the first and second fixed electrodes 11 and 12 and the dummy electrode 13 can be provided on the main surface 17 in the cavity 16 of the support substrate 10.

Figure 14:
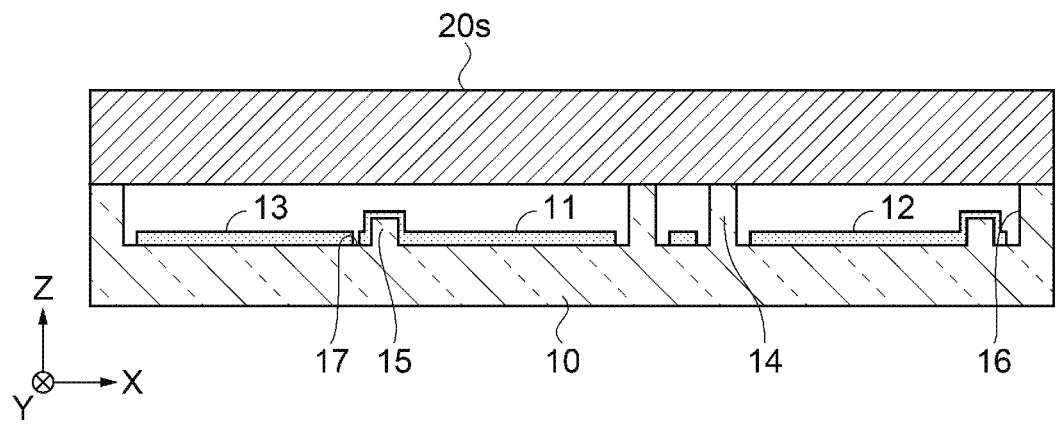
FIG. 14 is a sectional view of the physical quantity sensor in each manufacturing process.

Step S3 is a substrate bonding step for bonding the support substrate 10 and a silicon substrate 20S. As illustrated in FIG. 14, in the substrate bonding step, for example, the support substrate 10 and the silicon substrate 20S are bonded with each other using, for example, anodic bonding, direct bonding, or an adhesive.

Figure 15:
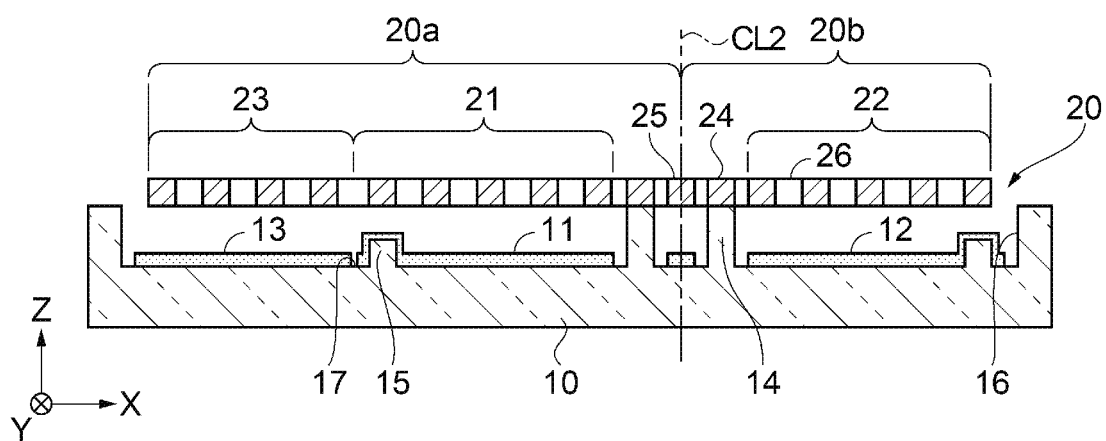
FIG. 15 is a sectional view of the physical quantity sensor in each manufacturing process.

Step S4 is a movable body forming step of forming the movable body 20 having the opening 26 from the silicon substrate 20S. In the movable body forming step, the silicon substrate 20S is ground, for example, using a grinding machine, and thinned to a predetermined thickness. Then, the movable body 20 is formed by patterning the silicon substrate 20S using a photolithography technique and an etching technique. For example, the silicon substrate 20S can be etched by a Bosch process using a reactive ion etching (RIE) apparatus. Thereby, as illustrated in FIG. 15, the movable body 20 including the opening 26, the support portion 24, and the beam portion 25 is integrally formed.

Figure 16:
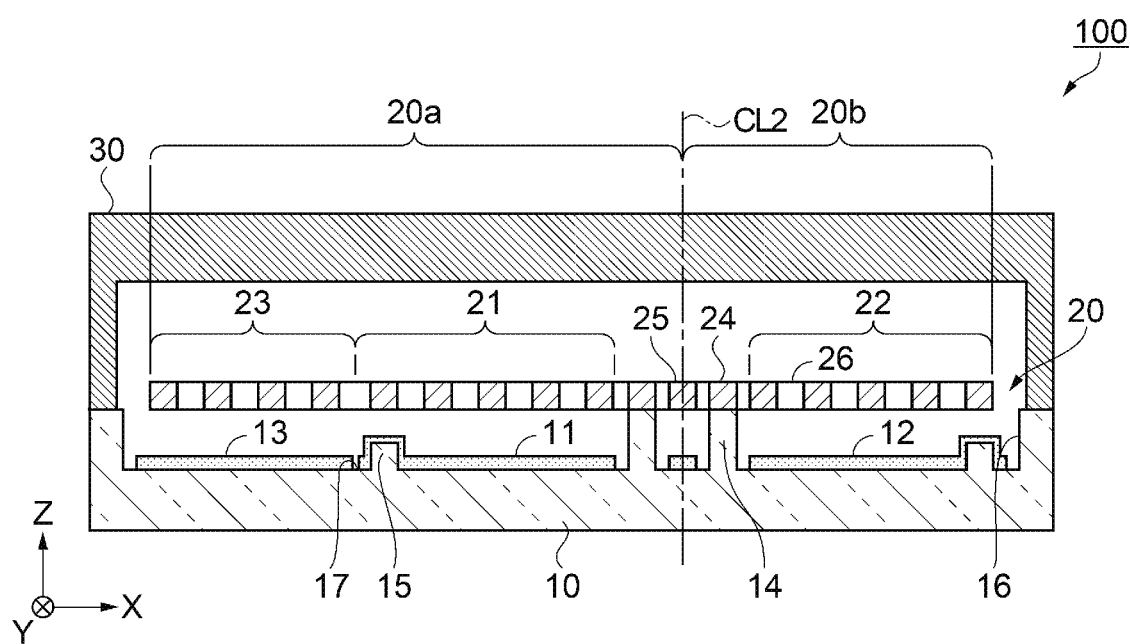
FIG. 16 is a sectional view of the physical quantity sensor in each manufacturing process.

Step S5 is a sealing step for sealing the movable body 20. In the sealing step, the lid 30 is bonded with the support substrate 10, and the movable body 20 is stored in a space formed by the support substrate 10 and the lid 30. The support substrate 10 and the lid 30 are bonded using, for example, anodic bonding, an adhesive, or the like. As illustrated in FIG. 16, the physical quantity sensor 100 is obtained. In a case where anodic bonding is used in the sealing step, it is possible to prevent the movable body 20 from sticking to the support substrate 10 by electrostatic force by forming the dummy electrode 13 having the same potential as that of the silicon substrate 20S on the main surface 17 other than the first and second fixed electrodes 11 and 12 of the support substrate 10.

As described above, according to the physical quantity sensor 100 according to the present embodiment, the following effects can be obtained.

The movable body 20 of the physical quantity sensor 100 includes the first and second mass portions 21 and 22, the beam portion 25, and the coupling portion 28. The first mass portion 21 and the second mass portion 22 are connected to the coupling portion 28 which is connected to the beam portion 25 and provided in the intersecting direction intersecting with the beam portion 25, and the movable body 20 rocks around the beam portion 25 as a rotation shaft. The protrusions 15 protruding toward the first and second mass portions 21 and 22 are provided on the support substrate 10 supporting the movable body 20 with a gap therebetween. The length L1 of the coupling portion 28 is extended to 1.4 or more times (L1/L2=1.4 or more) the length L2 from the center of the rotation shaft of the beam portion 25 to the first and second mass portions 21 and 22. For example, when the length of the coupling portion 28 is extended by 1.4 times, the bending stress applied to the coupling portion 28 decreases from 4.0 Mpa to 2.4 Mpa. As the length L1 of the coupling portion 28 extends, the bending stress applied to the coupling portion 28 decreases, and breakage occurring at the boundary portion between the coupling portion 28 and the first and second mass portions 21 and 22 is suppressed. Therefore, it is possible to provide the physical quantity sensor 100 having excellent impact resistance and improved reliability.

Since the first to third mass portions 21, 22, and 23 included in the movable body 20 have the square opening 26 penetrating in a lattice shape, the damping of the movable body 20 is reduced and the sensitivity for measuring the acceleration improves.

An interval L3 between the opening 26 provided in the first and second mass portions 21 and 22 and the slits 29a that extend the coupling portion 28 is wider than an interval L4 between the adjacent openings 26. Accordingly, the rigidity of the coupling portion 28 and the first and second mass portions 21 and 22 at the boundary relatively increases than the rigidity of the first and second mass portions 21 and 22, it is possible to suppress breakage occurring at the boundary of the coupling portion 28 and the first and second mass portions 21 and 22.

Since the coupling portion 28 overlaps the first and second fixed electrodes 11 and 12, the electrostatic capacitance C1 and C2 generated between the first movable body 20a and the first fixed electrode and between the second movable body 20b and the second fixed electrode become larger, and thereby the sensitivity for measuring an acceleration improves.

The width L6 of the slits 29b formed between the support portion 24 and the first and second mass portions 21 and 22 is set to 3 μm or less. Since the slits 29b do not disturb in-plane displacement generated when the first and second mass portions 21 and 22 rock (out-of-plane displacement) around the beam portion 25, accuracy for measuring the acceleration improves. When strong impact is applied in an in-plane direction, the slits 29b become a stopper that can reduce excessive displacement in plane, and since the in-plane displacement of the first and second mass portions 21 and 22 is suppressed to 3 μm or less, it is possible to realize a physical quantity sensor 100 with high reliability.

The width L5 of the slits 29a formed between the coupling portion 28 and the first and second mass portions 21 and 22 is set to 3 μm or less. In a case where the first and second mass portions 21 and 22 are in-plane displaced 3 μm or more in the direction approaching the coupling portion 28, since the first and second mass portions 21 and 22 are brought into contact with the coupling portion 28 by the displacement thereof, the in-plane displacement of the first and second mass portions 21 and 22 is suppressed to 3 μm or less. Accordingly, it is possible to prevent the breakage of the first and second mass portions 21 and 22 contacting with the coupling portion 28, it is possible to realize the physical quantity sensor 100 with high reliability.

The plurality of protrusions 15 are provided in a straight line parallel to the beam portion 25 as a rotation shaft. Accordingly, it is possible to distribute impact received when the movable body 20 and the protrusion 15 contacting each other. It is also possible to stabilize an attitude of the movable body 20 at the time of the contact.

Complex Sensor

Figure 17:
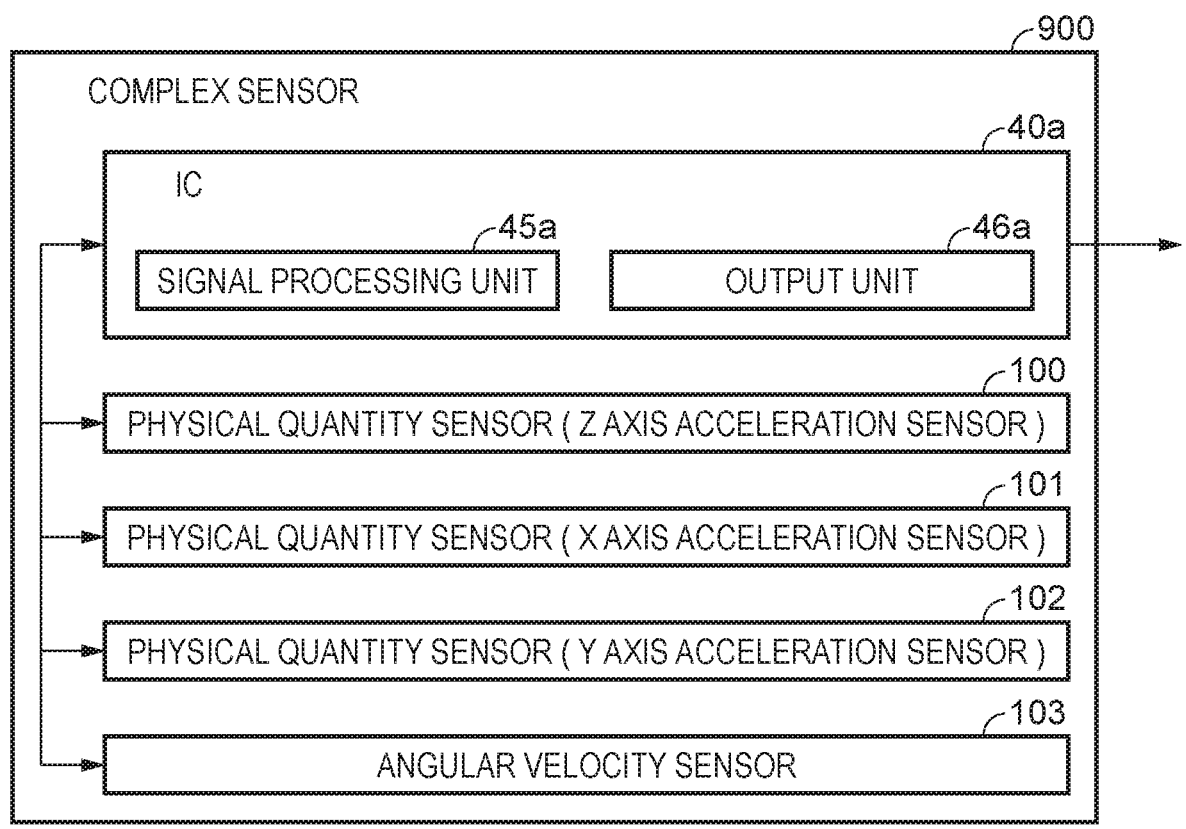
FIG. 17 is a functional block diagram illustrating a schematic configuration of a complex sensor.

Next, a configuration example of a complex sensor including the above-described physical quantity sensor 100 will be described with reference to FIG. 17. FIG. 17 is a functional block diagram illustrating a schematic configuration of a complex sensor.

As illustrated in FIG. 17, the complex sensor 900 includes the physical quantity sensor 100 which is an acceleration sensor for measuring the acceleration in the Z axis direction as described above, a physical quantity sensor 101 which is an acceleration sensor for measuring the acceleration in the X axis direction, a physical quantity sensor 102 which is an acceleration sensor for measuring the acceleration in the Y axis direction, and an angular velocity sensor 103. The angular velocity sensor 103 can efficiently and highly accurately measure the required angular velocity in the one axis direction. The angular velocity sensor 103 can also be provided with three angular velocity sensors 103 corresponding to the respective axial directions in order to measure the angular velocity in three axial directions. Moreover, the complex sensor 900 can include, for example, the IC 40a including, the physical quantity sensors 100, 101, and 102, a drive circuit that drives the angular velocity sensor 103, a measurement circuit (signal processing unit 45a) for measuring an acceleration and an angular velocity in the X axis, Y axis, and Z axis directions based on the physical quantity sensors 100, 101, and 102 and the signal from the angular velocity sensor 103, and an output circuit (output unit 46a) that converts a signal from the measurement circuit into a predetermined signal and outputs the signal.

In this manner, the complex sensor 900 can be easily constituted by the physical quantity sensors 100, 101, and 102 and the angular velocity sensor 103, and it is possible to easily obtain a plurality of physical quantity data, for example, acceleration data and angular velocity data by one sensor.

Inertial Measurement Unit

Figure 18:
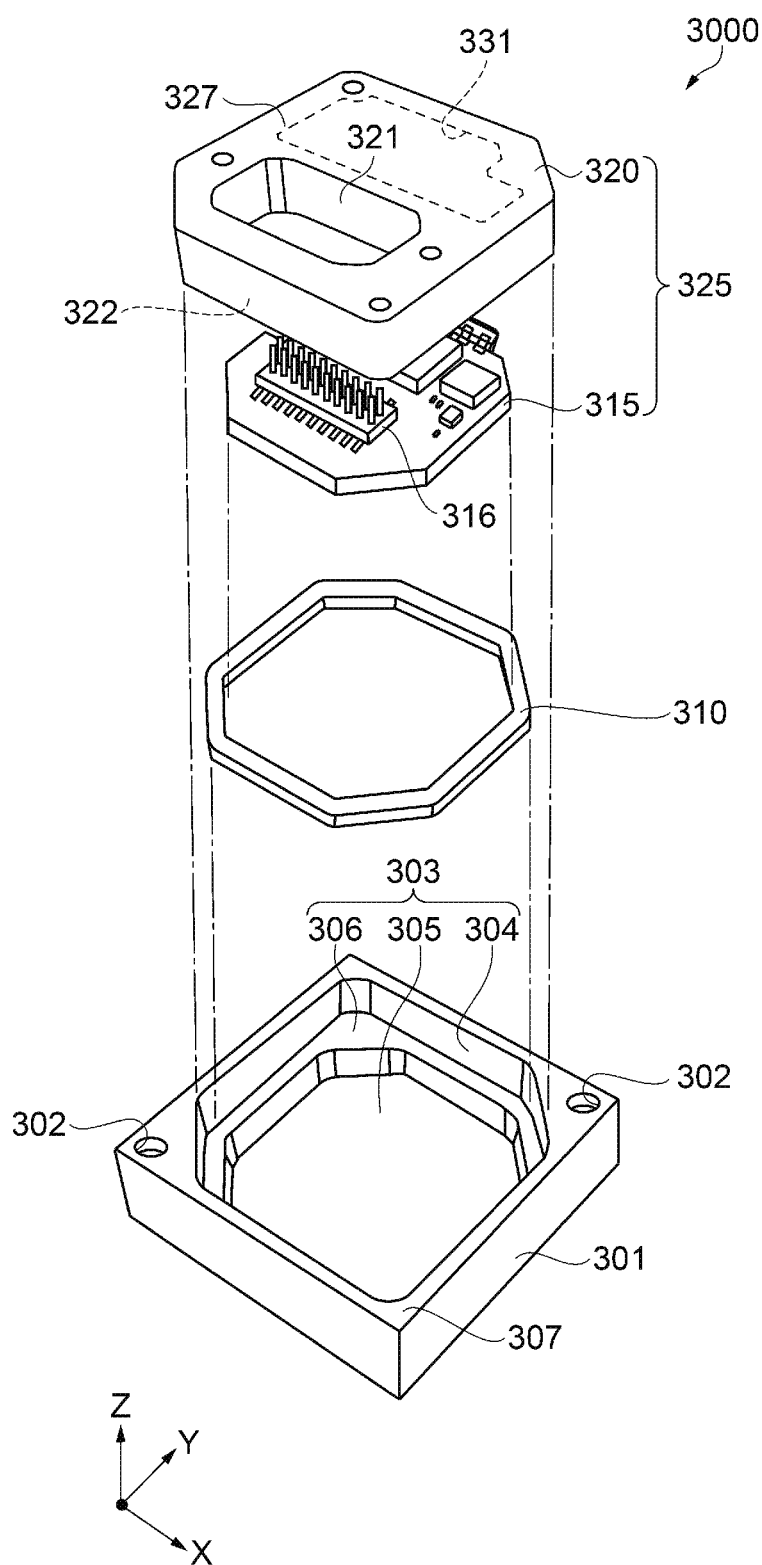
FIG. 18 is a disassembled perspective view illustrating a schematic configuration of an inertial measurement unit.
Figure 19:
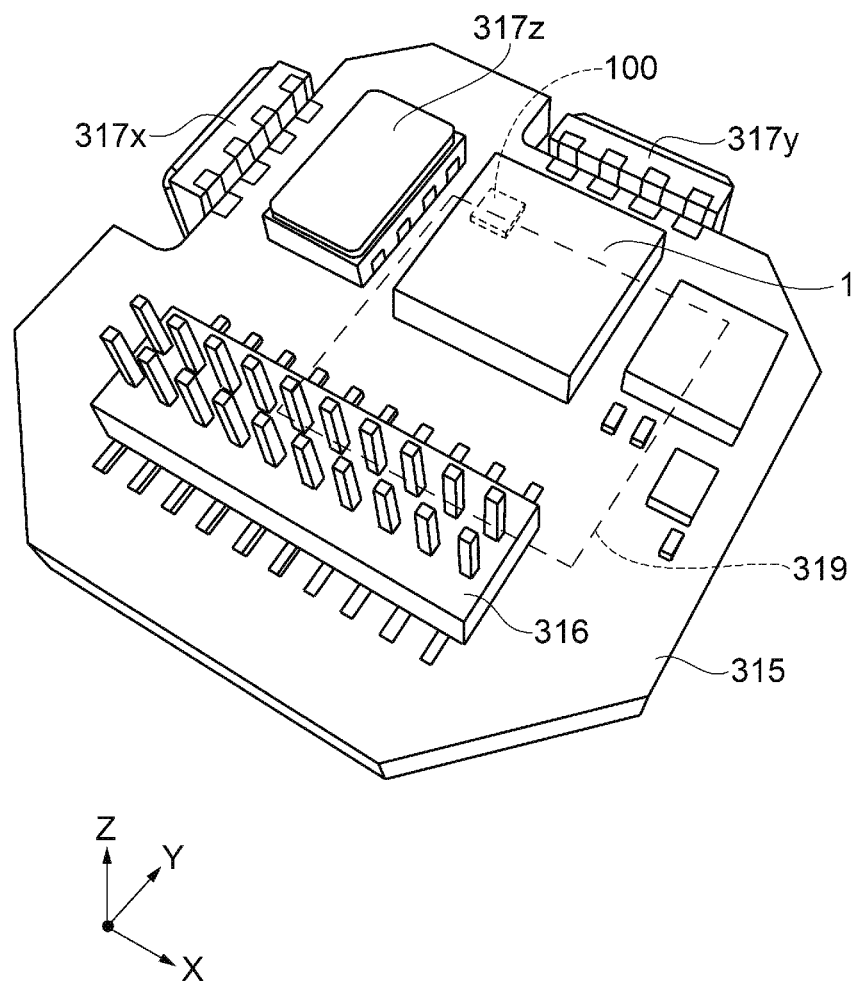
FIG. 19 is a perspective view illustrating a disposal example of an inertial sensor element of the inertial measurement unit.

Next, an inertial measurement unit (IMU) will be described with reference to FIGS. 18 and 19. FIG. 18 is a disassembled perspective view illustrating a schematic configuration of an inertial measurement unit. FIG. 19 is a perspective view illustrating a disposal example of an inertial sensor element of the inertial measurement unit.

As illustrated in FIG. 18, an inertial measurement unit 3000 is configured with a sensor module 325 including an outer case 301, a bonding member 310, and an inertial sensor element. In other words, the sensor module 325 is engaged (inserted) in an inner portion 303 of the outer case 301 with the bonding member 310 interposed therebetween. The sensor module 325 is configured with an inner case 320 and a substrate 315. To make the explanation easier to understand, although the site names are defined as the outer case and the inner case, it may be called the first case and the second case.

The outer case 301 is a pedestal from which aluminum is cut out into a box shape. The material is not limited to aluminum, and other metals such as zinc and stainless steel, resin, or a composite material of metal and resin may be used. The outer shape of the outer case 301 is a rectangular parallelepiped having a substantially square planar shape similar to the overall shape of the above-described inertial measurement unit 3000, and penetration holes (shortcut holes) 302 are formed in the vicinity of two apexes positioned in a diagonal direction of the square, respectively. The invention is not limited to the penetration holes (shortcut holes) 302. For example, a configuration in which a notch (structure in which a notch is formed at a corner portion of the outer case 301 where the penetration holes (shortcut holes) 302 are positioned) that can be screwed by screws is formed and screwed, or a configuration in which a flange (ears) is formed on the side surface of the outer case 301 and the flange portion is screwed may be adopted.

The outer case 301 has a rectangular parallelepiped and a box-like shape without a lid, and the inner portion 303 (inside) thereof is an internal space (container) surrounded by a bottom wall 305 and a side wall 304. In other words, the outer case 301 has a box shape having one surface opposite to the bottom wall 305 as an opening surface, the sensor module 325 is stored so as to cover most of the opening portion of the opening surface (so as to close the opening portion), and the sensor module 325 is exposed from the opening portion (not illustrated). Here, the opening surface opposite to the bottom wall 305 is the same surface as an upper surface 307 of the outer case 301. The planar shape of the inner portion 303 of the outer case 301 is a hexagon obtained by chamfering corners of two apex portions of a square, and the two chamfered apex portions correspond to the positions of the penetration holes (shortcut holes) 302. In the cross-sectional shape (thickness direction) of the inner portion 303, the inner portion 303, that is, a first bonding surface 306 as a bottom wall one step higher than the central portion is formed on the peripheral edge portion of the internal space in the bottom wall 305. That is, the first bonding surface 306 is a part of the bottom wall 305, is a single step-like site portion formed in a ring shape surrounding the central portion of the bottom wall 305 in plan view, and is a surface with a smaller distance from the opening surface (same surface as the upper surface 307) than the bottom wall 305.

An example in which the outer shape of the outer case 301 is a rectangular parallelepiped having a substantially square planar shape and a box shape without a lid is described. However, the invention is not limited to this. The planar shape of the outer shape of the outer case 301 may be, for example, a polygon such as a hexagon or an octagon, the corners of the apex portions of the polygon may be chamfered or may be a planar shape in which each side is a curved line. The planar shape of the inner portion 303 (inside) of the outer case 301 is not limited to the above-mentioned hexagon, and it may be a rectangle (tetragon) such as a square or another polygonal shape such as an octagon. The outer shape of the outer case 301 and the planar shape of the inner portion 303 may be similar or may not be similar figures.

The inner case 320 is a member that supports the substrate 315 and has a shape to fit in the inner portion 303 of the outer case 301. Specifically, in a plan view, the shape thereof is a hexagon that the corners of the two apex portions of the square are chamfered, and an opening portion 321 that is a rectangular through-hole and a recess portion 331 that is provided on the surface that supports the substrate 315 are formed therein. The two chamfered apex portions correspond to the positions of the penetration holes (shortcut holes) 302 of the outer case 301. The height in the thickness direction (Z axis direction) is lower than the height from the upper surface 307 of the outer case 301 to the first bonding surface 306. In the preferred example, the inner case 320 is also formed by scraping out aluminum, but other materials may be used like the outer case 301.

Guide pins and supporting surfaces (not illustrated) for positioning the substrate 315 are formed on a rear surface (surface on the side of outer case 301) of the inner case 320. The substrate 315 is set (positioned and installed) on the guide pin and the support surface and adheres to the rear surface of the inner case 320. Details of the substrate 315 will be described later. The peripheral edge portion of the rear surface of the inner case 320 is a second bonding surface 322 formed of a ring-shaped flat surface. The second bonding surface 322 has a planar shape substantially similar to that of the first bonding surface 306 of the outer case 301 in the plan view, and when the inner case 320 is set on the outer case 301, the two surfaces face each other with the bonding member 310 sandwiched therebetween. The configurations of the outer case 301 and the inner case 320 are one example, and the invention is not limited to this structure.

A configuration of the substrate 315 on which an inertial sensor is mounted will be described with reference to FIG. 19. As illustrated in FIG. 19, the substrate 315 is a multilayer substrate having a plurality of through-holes formed therein, and a glass epoxy substrate is used as the substrate 315. It is not limited to a glass epoxy substrate, and any rigid substrate capable of mounting a plurality of inertial sensors, electronic components, connectors and the like may be used. For example, a composite substrate or a ceramic substrate may be used.

On a surface of the substrate 315 (surface on the side of the inner case 320), a connector 316, an angular velocity sensor 317z, and an acceleration measurement unit 1 including the physical quantity sensor 100 as the above-described acceleration sensor for measuring the acceleration in the Z axis direction, and the like are mounted. The connector 316 is a plug type (male) connector, and is provided with two rows of connection terminals disposed at an equal pitch in the X axis direction. Preferably, 20 pins of connection terminals of in total (two rows of 10 pins in one row) are used. However, the number of terminals may be appropriately changed according to design specifications.

The angular velocity sensor 317z as an inertial sensor is a gyro sensor that measures an angular velocity of one axis in the Z axis direction. As a preferred example, an oscillating gyro sensor which uses crystal as an oscillator and measures an angular velocity from the Coriolis force applied to an oscillating object is used. It is not limited to an oscillating gyro sensor but may be a sensor capable of measuring an angular velocity. For example, a sensor using ceramics or silicon as the oscillator may be used.

On the side surface of the substrate 315 in the X axis direction, an angular velocity sensor 317x for measuring the angular velocity of one axis in the X axis direction is mounted so that the mounting surface (installation surface) is orthogonal to the X axis. Similarly, on the side surface in the Y axis direction of the substrate 315, an angular velocity sensor 317y for measuring the angular velocity of one axis in the Y axis direction is mounted so that the mounting surface (installation surface) is orthogonal to the Y axis.

The angular velocity sensors 317x, 317y, and 317z are not limited to the configuration using three angular velocity sensors for each axis of the X axis, the Y axis, and the Z axis, and any sensor capable of measuring the angular velocities in three axes can be used. For example, a sensor device capable of measuring (detecting) angular velocities of three axes with one device (package) may be used.

The acceleration measurement unit 1 includes at least the physical quantity sensor 100 as the above-described acceleration sensor for measuring the acceleration in the Z axis direction, and it is possible to measure acceleration of one axis direction (such as Z axis direction), two axis directions (such as Z axis and Y axis, or X axis and Y axis) or three axis directions (X axis, Y axis, Z axis) if necessary.

A control IC 319 as a control unit is mounted on the rear surface (surface on the outer case 301 side) of the substrate 315. The control IC 319 is a micro controller unit (MCU) that incorporates a storage unit including a nonvolatile memory, an A/D converter, and the like, and controls each portion of the inertial measurement unit 3000. The storage unit stores a program that defines the order and contents for measuring an acceleration and an angular velocity, a program that digitizes measurement data and incorporates the measured data into packet data, accompanying data, and the like in the storage unit. A plurality of electronic components are mounted on the substrate 315.

According to such an inertial measurement unit 3000, since the acceleration measurement unit 1 including the physical quantity sensor 100 is used, it is possible to provide the inertial measurement unit 3000 with excellent impact resistance and improved reliability.

Portable Electronic Device

Next, a portable electronic device using the physical quantity sensor 100 will be described based on FIGS. 20 and 21. Hereinafter, a wristwatch type activity meter (active tracker) will be described as an example of a portable electronic device.

Figure 20:
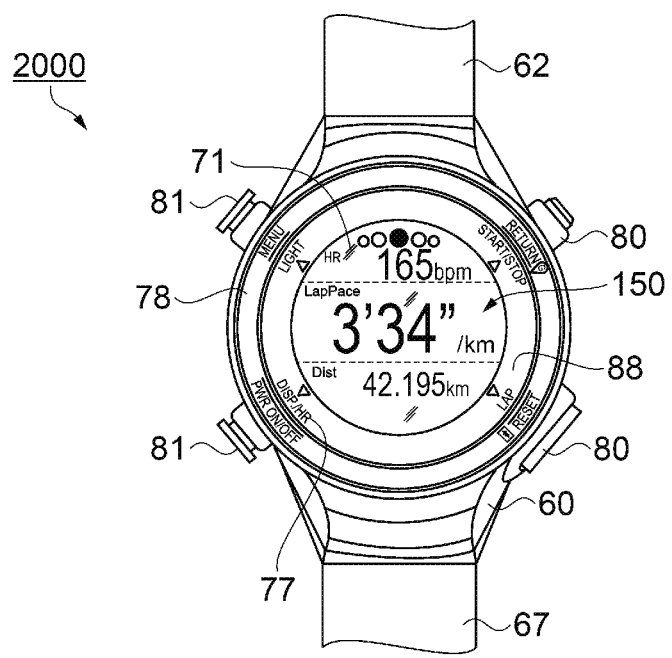
FIG. 20 is a plan view illustrating a schematic configuration of a portable electronic device.
Figure 21:
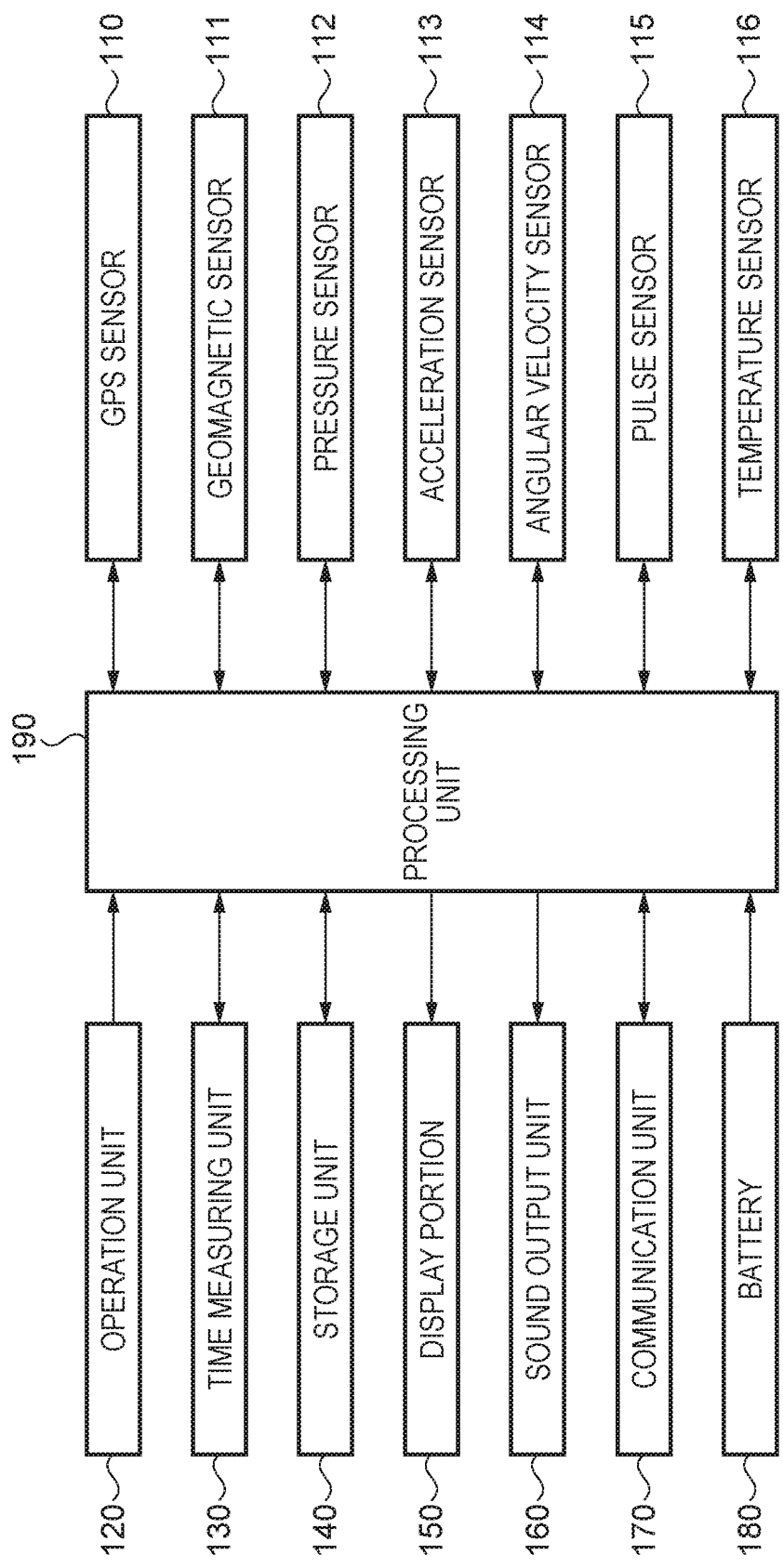
FIG. 21 is a functional block diagram illustrating a schematic configuration of the portable electronic device.

As described in FIG. 20, a wrist device 2000 that is the wristwatch type activity meter (active tracker) is attached to a site (subject) such as a wrist of a user by bands 62 and 67 or the like, has a display portion 150 of digital display and can perform wireless communication. The above-described physical quantity sensor 100 according to the invention is incorporated in the wrist device 2000 as a sensor for measuring an acceleration or a sensor for measuring an angular velocity.

The wrist device 2000 includes at least the case 60 in which the physical quantity sensor 100 is stored, a processing unit 190 (See FIG. 21) that is stored in the case 60, and processes output data from the physical quantity sensor 100, the display portion 150 stored in the case 60, and a light-transmissive cover 71 that covers an opening portion of the case 60. On the outside of the case 60 of the light-transmissive cover 71, a bezel 78 is provided. On the side surface of the case 60, a plurality of operation buttons 80 and 81 are provided. Hereinafter, it will be described in more detail referring also to FIG. 21.

An acceleration sensor 113 including the physical quantity sensor 100 measures each acceleration in three axis directions intersecting (ideally, orthogonal) each other, and outputs a signal (acceleration signal) corresponding to the magnitude and direction of the measured three-axis accelerations. An angular velocity sensor 114 measures each angular velocity in three axis directions intersecting (ideally, orthogonal) each other, and outputs a signal (angular velocity signal) corresponding to the magnitude and direction of the measured three-axis angular velocities.

On a liquid crystal display (LCD) constituting the display portion 150, depending on each measurement mode, for example, position information using a GPS sensor 110 or a geomagnetic sensor 111, motion information such as movement amount, exercise amount using the acceleration sensor 113 included in the physical quantity sensor 100 or the angular velocity sensor 114, biometric information such as pulse rate using a pulse sensor 115, time information such as current time, and the like are displayed. It is also possible to display the ambient temperature using a temperature sensor 116.

A communication unit 170 performs various controls for establishing communication between the user terminal and the information terminal (not illustrated). The communication unit 170 includes, for example, Bluetooth (registered trademark) (including BTLE: Bluetooth Low Energy), Wi-Fi (registered trademark) (Wireless Fidelity), Zigbee (registered trademark), near field communication (NFC), and ANT+ (registered trademark) as a transmitter and receiver compatible with the short distance wireless communication standard, and the communication unit 170 is configured to include a connector compatible with a communication bus standard such as a universal serial bus (USB).

The processing unit 190 (processor) is configured by, for example, a micro processing unit (MPU), a digital signal processor (DSP), and an application specific integrated circuit (ASIC). The processing unit 190 executes various processes based on the program stored in a storage unit 140 and the signal input from an operation unit 120 (for example, operation buttons 80 and 81). Processing by the processing unit 190 includes data processing for each output signal of the GPS sensor 110, the geomagnetic sensor 111, a pressure sensor 112, the acceleration sensor 113, the angular velocity sensor 114, the pulse sensor 115, the temperature sensor 116, and a time measuring unit 130, display processing for displaying an image on a display portion 150, a sound output process for outputting a sound to a sound output unit 160, communication processing for communicating with an information terminal (not illustrated) via the communication unit 170, power control processing for supplying power from a battery 180 to each unit, and the like.

In such a wrist device 2000, at least the following functions can be provided.

1. Distance: Measure the total distance from the start of measurement with high accuracy GPS function
2. Pace: Display the current travel pace from the pace distance measurement
3. Average speed: Calculate and display average speed from the average speed running start to the present
4. Height: Measure and display altitude by GPS function.
5. Stride: Measure and display the stride even in a tunnel and the like where GPS radio waves do not reach
6. Pitch: Measure and display the number of steps per minute
7. Heart Rate: Measure and display heart rate with pulse sensor 8. Gradient: Measure and display the gradient of the ground in training and trail runs in the mountains 9. Autolap: Automatically perform lap measurement when running for a fixed distance or for a fixed time set in advance 10. Exercise consumption calorie: Display calorie consumption 11. Number of steps: Display the total number of steps from the start of the exercise The wrist device 2000 can be widely applied to a running watch, a runner's watch, a multi-sports compatible runner's watch such as Duathlon and triathlon, an outdoor watch, and a GPS watch in which a satellite positioning system such as GPS is installed, and the like.

A global positioning system (GPS) as a satellite positioning system is described above, and other global navigation satellite systems (GNSS) may be used. For example, any one or more satellite positioning system of European geostationary-satellite navigation overlay service (EGNOS), Quasi Zenith satellite system (QZSS), global navigation satellite system (GLONASS), GALILEO, BeiDou navigation satellite system (BeiDou) may be used. At least one of satellite-based augmentation systems (SBAS) such as a wide area augmentation system (WAAS), a European geostationary-satellite navigation overlay service (EGNOS) may be used for the satellite positioning systems.

Since such a portable electronic device (wrist device 2000) is provided with the physical quantity sensor 100, and the processing unit 190, it has excellent reliability such as impact resistance.

Electronic Device

Next, an electronic device provided with the physical quantity sensor 100 according to the embodiment of the invention will be described with reference to FIG. 22 to FIG. 24.

Figure 22:
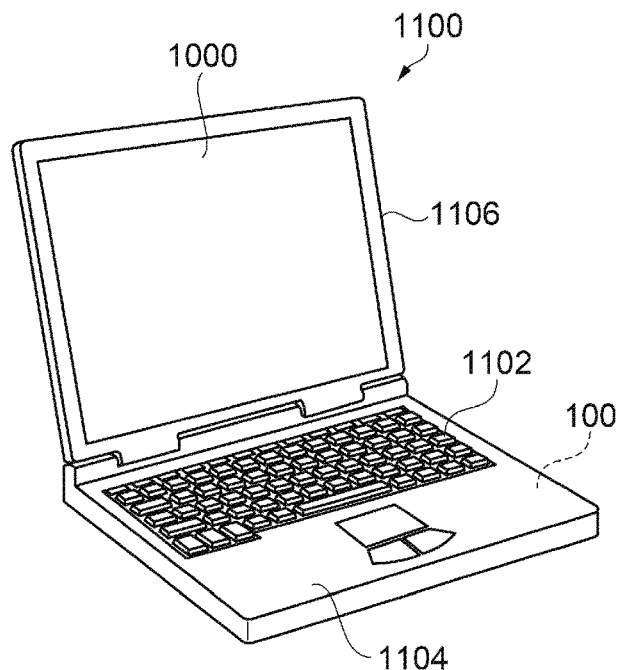
FIG. 22 is a perspective view illustrating a schematic configuration of a mobile type (or notebook type) personal computer as an electronic device that includes the physical quantity sensor.

FIG. 22 is a perspective view illustrating a schematic configuration of a mobile type (or notebook type) personal computer as an electronic device that includes the physical quantity sensor according to the embodiment of the invention. In FIG. 22, a personal computer 1100 is configured with a main body portion 1104 having a keyboard 1102 and a display unit 1106 having a display portion 1000, and the display unit 1106 is rockably supported relative to the main body portion 1104 via a hinge structure portion. In such a personal computer 1100, the physical quantity sensor 100 functioning as the acceleration sensor is incorporated, and a control unit (not illustrated) can perform control such as attitude control based on the measurement signal from the physical quantity sensor 100.

Figure 23:
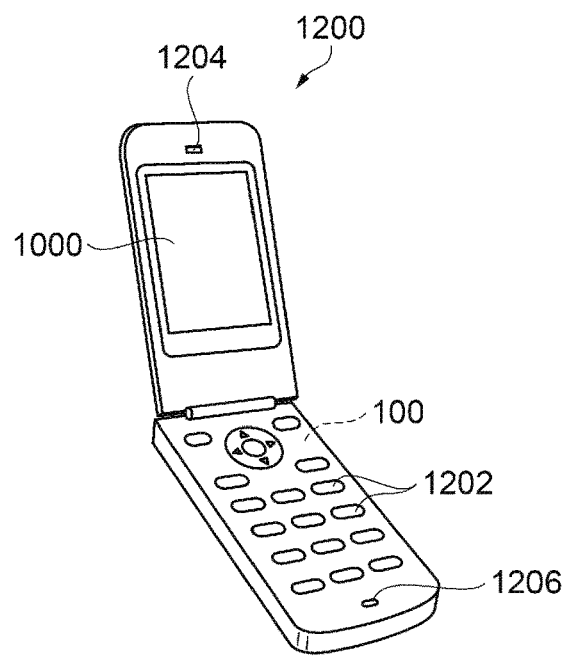
FIG. 23 is a perspective view illustrating a schematic configuration of a mobile phone (including PHS) as an electronic device that includes the physical quantity sensor.

FIG. 23 is a perspective view illustrating a schematic configuration of a mobile phone (including PHS) as an electronic device including a physical quantity sensor according to the embodiment of the invention. In FIG. 23, the mobile phone 1200 includes a plurality of operation buttons 1202, an earpiece 1204, and a mouthpiece 1206, and a display portion 1000 is disposed between the operation button 1202 and the earpiece 1204. In such a mobile phone 1200, the physical quantity sensor 100 that functions as the acceleration sensor and the like is incorporated, and a control unit (not illustrated) that can, for example, recognize the attitude and behavior of the mobile phone 1200, change the display image displayed on a display portion 1000, sound an alarm sound or effect sound, or drive the oscillation motor to oscillate the main body based on the measurement signal from the physical quantity sensor 100.

Figure 24:
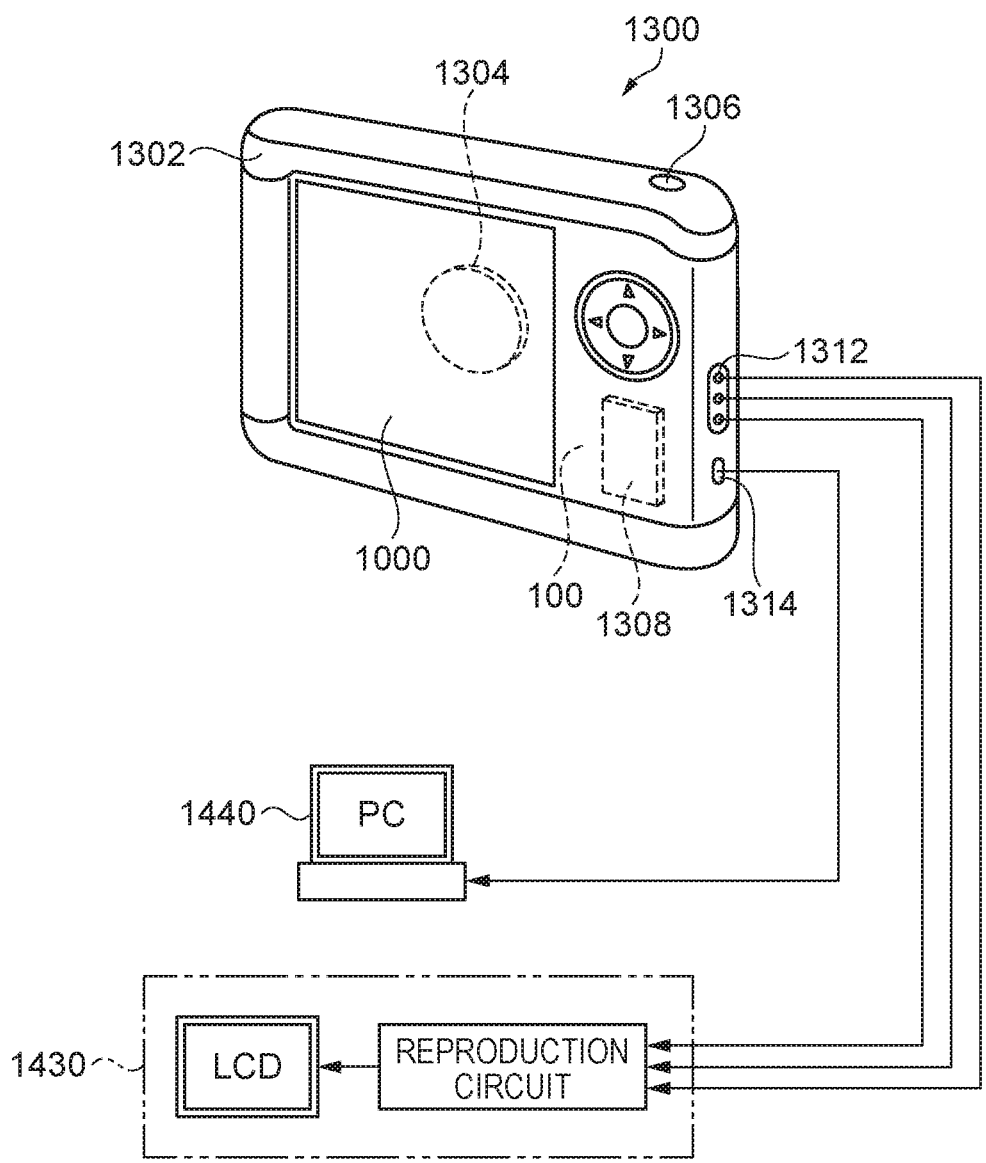
FIG. 24 is a perspective view illustrating a schematic configuration of a digital still camera as an electronic device including the physical quantity sensor.

FIG. 24 is a perspective view illustrating a schematic configuration of a digital still camera as an electronic device including the physical quantity sensor according to the embodiment of the invention. In FIG. 24, connections with external devices are also illustrated briefly. Here, while a film camera in the related art exposes a silver salt photographic film with an optical image of a subject, a digital still camera 1300 photoelectrically converts an optical image of a subject with an image pickup element such as a charge coupled device (CCD) to generate an image pickup signal (image signal).

A display portion 1000 is provided on a back surface of a case (body) 1302 of the digital still camera 1300, and display is performed based on an image pickup signal by the CCD. The display portion 1000 functions as a finder that displays the subject as an electronic image. A light receiving unit 1304 including an optical lens (image pickup optical system) and a CCD or the like is provided on the front side (rear side in the drawing) of the case 1302.

When a photographer checks the subject image displayed on the display portion 1000 and presses a shutter button 1306, the image pickup signal of the CCD at that time is transferred and stored in a memory 1308. The digital still camera 1300 is provided with a video signal output terminal 1312 and an input and output terminal for data communication 1314 on a side surface of the case 1302. As illustrated in FIG. 24, a television monitor 1430 is connected to the video signal output terminal 1312 and a personal computer 1440 is connected to the input and output terminal for data communication 1314, respectively, as required. The image pickup signal stored in the memory 1308 is output to the television monitor 1430 or the personal computer 1440 by a predetermined operation. In such a digital still camera 1300, the physical quantity sensor 100 functioning as the acceleration sensor is incorporated, and a control unit (not illustrated) can perform control such as hand-shake correction based on the measurement signal from the physical quantity sensor 100.

The electronic devices 1100, 1200, and 1300 as described above include a physical quantity sensor 100 capable of improving reliability and measurement sensitivity. Thereby, the electronic devices 1100, 1200, and 1300 can have high reliability and measurement sensitivity.

The physical quantity sensor 100 according to the embodiment of the invention can be applied to an electronic device including, for example, an ink jet type discharging device (for example, an ink jet printer), a laptop type personal computer, a television, a video camera, a video tape recorder, a car navigation device, a pager, an electronic notebook (including communication function), an electronic dictionary, a calculator, an electronic game machine, a word processor, a workstation, a video phone, a security monitor for television, an electronic binocular, a POS terminal, a medical device (for example, an electronic thermometer, a blood pressure monitor, a blood glucose meter, an electrocardiogram measurement device, ultrasonic diagnostic equipment, electronic endoscope), a fish finder, various measuring instruments, instruments (for example, instruments of vehicles, aircraft, ships), or a flight simulator, in addition to the personal computer 1100 (mobile type personal computer) in FIG. 22, the mobile phone 1200 in FIG. 23, and the digital still camera 1300 in FIG. 24.

Vehicle

Figure 25:
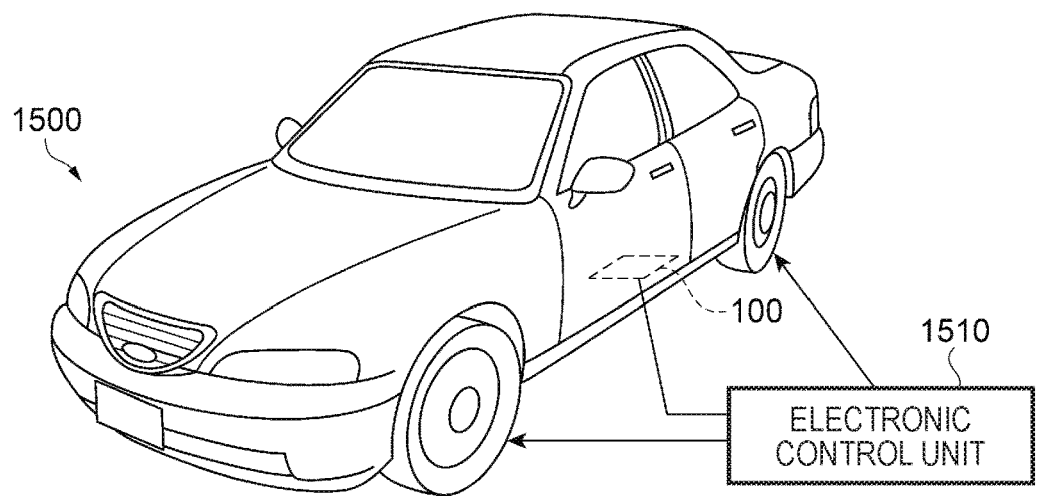
FIG. 25 is a perspective view schematically illustrating an automobile as a vehicle including the physical quantity sensor.

FIG. 25 is a perspective view schematically illustrating an automobile as a vehicle including the physical quantity sensor according to the embodiment of the invention. The physical quantity sensor 100 according to the embodiment is installed on the automobile 1500. For example, as illustrated in FIG. 25, an electronic control unit 1510 that incorporates the physical quantity sensor 100 and controls a tire or the like as a control unit is installed on the vehicle in the automobile 1500 as a vehicle. The physical quantity sensor 100 can also be widely applied to electronic control units (ECU) such as a keyless entry, an immobilizer, a car navigation system, a car air conditioner, an antilock brake system (ABS), an airbag, a tire pressure monitoring system (TPMS), engine control, a battery monitor of a hybrid car or an electric car, and a vehicle attitude control system.

The entire disclosure of Japanese Patent Application No. 2017-165178, filed Aug. 30, 2017 is expressly incorporated by reference herein.

What is claimed is:

1. A physical quantity sensor comprising:
    three axes orthogonal to each other being defined as an X axis, a Y axis, and a Z axis;
    a support substrate having a surface;
    first and second measurement electrodes disposed on the surface of the support substrate;
    first and second projections disposed on the surface of the support substrate, the first and second projections projecting from the surface of the support substrate along the Z axis;
    a support column disposed on the surface of the support substrate, the support column projecting from the surface of the support substrate along the Z axis, a height of the support column being greater than a height of the first projection and a height of the second projection; and
    a movable body that is rectangular-plate-shaped on a plane along the X axis and the Y axis, the movable body having a thickness along the Z axis, the movable body having first and second sides opposite to each other along the Y axis and extending along the X axis, the movable body having third and fourth sides opposite to each other along the X axis and extending along the Y axis, the first and second sides being longer than the third and fourth sides, the movable body being configured with:
        a rotation shaft, the rotation shaft extending along the Y axis;
        a support fixed on a top of the support column, a part of the support continuously extending from the rotation shaft;
        first and second coupling members that are located directly adjacent to the first and second sides, respectively, both ends along the Y axis of the rotation shaft being connected to the first and second coupling members; and
        first and second masses located at both sides of the rotation shaft, the first and second masses facing the first and second measurement electrodes, respectively, and facing the first and second projections, respectively,
    wherein a length of each of the first and second coupling members along the X axis is 1.4 or more times a distance along the X axis between the rotation shaft and each of the first and second masses.

2. The physical quantity sensor according to claim 1,
    wherein the movable body has first and second slits that are formed between the first coupling member and the first and second masses, respectively, and the movable body has third and fourth slits that are formed between the second coupling member and the first and second masses, respectively,
    each of the first and second masses has a plurality of openings that penetrate in a lattice shape, and a first opening of the plurality of openings is located directly adjacent to the first slit, and
    a distance between the first opening and the first slit is longer than a distance between adjacent openings of the plurality of openings.

3. The physical quantity sensor according to claim 2,
    wherein a width of each of the first, second, third, and fourth slits is 3 µm or less.

4. The physical quantity sensor according to claim 1,
    wherein each of the first and second coupling members overlaps the first and second measurement electrodes along the Z axis.

5. The physical quantity sensor according to claim 1,
    the support of the movable body has first and second support sections, and the first and second support sections face the first and second masses via fifth and sixth slits, respectively, along the X axis, and
    a width of each of the fifth and sixth slits is 3 µm or less.

6. The physical quantity sensor according to claim 1, further comprising:
    third and fourth projections disposed on the surface of the support substrate, the third and fourth projections projecting from the surface of the support substrate along the Z axis
    wherein the first and second masses face the third and fourth protrusions, respectively, and
    the first and third protrusions align with each other along the Y axis, and the second and fourth protrusions align with each other along the Y axis.

7. A complex sensor comprising:
    three axes orthogonal to each other being defined as an X axis, a Y axis, and a Z axis;
    an angular velocity sensor; and
    a physical quantity sensor, the physical quantity sensor including:
        a support substrate having a surface;
        first and second measurement electrodes disposed on the surface of the support substrate;
        first and second projections disposed on the surface of the support substrate, the first and second projections projecting from the surface of the support substrate along the Z axis;
        a support column disposed on the surface of the support substrate, the support column projecting from the surface of the support substrate along the Z axis, a height of the support column being greater than a height of the first projection and a height of the second projection; and
        a movable body that is rectangular-plate-shaped on a plane along the X axis and the Y axis, the movable body having a thickness along the Z axis, the movable body having first and second sides opposite to each other along the Y axis and extending along the X axis, the movable body having third and fourth sides opposite to each other along the X axis and extending along the Y axis, the first and second sides being longer than the third and fourth sides, the movable body being configured with:
            a rotation shaft, the rotation shaft extending along the Y axis;
            a support fixed on a top of the support column, a part of the support continuously extending from the rotation shaft;
            first and second coupling members that are located directly adjacent to the first and second sides, respectively, both ends along the Y axis of the rotation shaft being connected to the first and second coupling members; and first and second masses located at both sides of the rotation shaft, the first and second masses facing the first and second measurement electrodes, respectively, and facing the first and second projections, respectively, wherein a length of each of the first and second coupling members along the X axis is 1.4 or more times a distance along the X axis between the rotation shaft and each of the first and second masses.

8. The complex sensor according to claim 7, wherein the movable body has first and second slits that are formed between the first coupling member and the first and second masses, respectively, and the movable body has third and fourth slits that are formed between the second coupling member and the first and second masses, respectively, each of the first and second masses has a plurality of openings that penetrate in a lattice shape, and a first opening of the plurality of openings is located directly adjacent to the first slit, and a distance between the first opening and the first slit is longer than a distance between adjacent openings of the plurality of openings.

9. The complex sensor according to claim 7, wherein each of the first and second coupling members overlaps the first and second measurement electrodes along the Z axis.

10. An inertial measurement unit comprising:

three axes orthogonal to each other being defined as an X axis, a Y axis, and a Z axis;

an angular velocity sensor;

a physical quantity sensor, the physical quantity sensor including:

a support substrate having a surface;

first and second measurement electrodes disposed on the surface of the support substrate;

first and second projections disposed on the surface of the support substrate, the first and second projections projecting from the surface of the support substrate along the Z axis;

a support column disposed on the surface of the support substrate, the support column projecting from the surface of the support substrate along the Z axis, a height of the support column being greater than a height of the first projection and a height of the second projection; and a movable body that is rectangular-plate-shaped on a plane along the X axis and the Y axis, the movable body having a thickness along the Z axis, the movable body having first and second sides opposite to each other along the Y axis and extending along the X axis, the movable body having third and fourth sides opposite to each other along the X axis and extending along the Y axis, the first and second sides being longer than the third and fourth sides, the movable body being configured with:

a rotation shaft, the rotation shaft extending along the Y axis;

a support fixed on a top of the support column, a part of the support continuously extending from the rotation shaft;

first and second coupling members that are located directly adjacent to the first and second sides, respectively, both ends along the Y axis of the rotation shaft being connected to the first and second coupling members; and first and second masses located at both sides of the rotation shaft, the first and second masses facing the first and second measurement electrodes, respectively, and facing the first and second projections, respectively; and a controller configured to control the physical quantity sensor and the angular velocity sensor, wherein a length of each of the first and second coupling members along the X axis is 1.4 or more times a distance along the X axis between the rotation shaft and each of the first and second masses.

11. The inertial measurement unit according to claim 10, wherein the movable body has first and second slits that are formed between the first coupling member and the first and second masses, respectively, and the movable body has third and fourth slits that are formed between the second coupling member and the first and second masses, respectively, each of the first and second masses has a plurality of openings that penetrate in a lattice shape, and a first opening of the plurality of openings is located directly adjacent to the first slit, and a distance between the first opening and the first slit is longer than a distance between adjacent openings of the plurality of openings.

12. The inertial measurement unit according to claim 10, wherein each of the first and second coupling members overlaps the first and second measurement electrodes along the Z axis.

* * * * *